United States Patent
Wang

(10) Patent No.: US 11,837,170 B2
(45) Date of Patent: Dec. 5, 2023

(54) DISPLAY SUBSTRATE, DRIVING METHOD THEREOF AND DISPLAY APPARATUS

(71) Applicant: BOE TECHNOLOGY GROUP CO., LTD., Beijing (CN)

(72) Inventor: Zhichong Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/914,335

(22) PCT Filed: Oct. 28, 2021

(86) PCT No.: PCT/CN2021/126887
§ 371 (c)(1),
(2) Date: Sep. 24, 2022

(87) PCT Pub. No.: WO2022/188427
PCT Pub. Date: Sep. 15, 2022

(65) Prior Publication Data
US 2023/0115238 A1   Apr. 13, 2023

(30) Foreign Application Priority Data
Mar. 9, 2021 (CN) .......................... 202110256403.2

(51) Int. Cl.
*G09G 3/3258* (2016.01)
*G09G 3/3291* (2016.01)

(52) U.S. Cl.
CPC ......... *G09G 3/3258* (2013.01); *G09G 3/3291* (2013.01); *G09G 2300/0426* (2013.01)

(58) Field of Classification Search
CPC .. G09G 3/3233; G09G 3/3258; G09G 3/3291; H10K 59/131
See application file for complete search history.

(56) References Cited

U.S. PATENT DOCUMENTS

| 10,909,920 | B2* | 2/2021 | Zhu | ...................... G09G 3/3233 |
| 2005/0258466 | A1* | 11/2005 | Kwak | ...................... H01L 28/60 |
| | | | | 257/532 |

(Continued)

FOREIGN PATENT DOCUMENTS

| CN | 101373578 A | 2/2009 |
| CN | 103077680 A | 5/2013 |

(Continued)

OTHER PUBLICATIONS

China Patent Office, CN202110256403.2 First Office Action dated Mar. 17, 2022.

(Continued)

*Primary Examiner* — Sardis F Azongha
(74) *Attorney, Agent, or Firm* — HOUTTEMAN LAW LLC

(57) ABSTRACT

A display substrate includes: M rows of pixel circuits and M rows of scan signal lines. Each pixel circuit includes: a driving transistor connected to a first power line and a light-emitting device; a first storage sub-circuit connected to a gate electrode of the driving transistor; a second storage sub-circuit connected to the first power line and the gate electrode of the driving transistor; a gating sub-circuit connected to the first storage sub-circuit, an $(m-1)^{th}$ row of scan signal line, and an $m^{th}$ row of scan signal line, where the gating sub-circuit is configured to: provide a data voltage signal to the first storage sub-circuit, and provide a reference voltage signal to the first storage sub-circuit; and a threshold compensation sub-circuit connected to the $(m-1)^{th}$ row of scan signal line, and configured to perform, in response to control of connected scan signal line, threshold compensation on the driving transistor.

16 Claims, 23 Drawing Sheets

(56) References Cited

U.S. PATENT DOCUMENTS

| | | | |
|---|---|---|---|
| 2006/0028408 A1* | 2/2006 | Kim | G09G 3/3233 |
| | | | 345/76 |
| 2011/0157143 A1 | 6/2011 | Choi et al. | |
| 2016/0233288 A1 | 8/2016 | Lee et al. | |
| 2018/0006105 A1 | 1/2018 | Kim et al. | |
| 2018/0082636 A1* | 3/2018 | Cai | G09G 3/3233 |
| 2019/0056616 A1 | 2/2019 | Wang et al. | |
| 2020/0286972 A1 | 9/2020 | Seo et al. | |
| 2021/0359055 A1* | 11/2021 | Lee | H10K 59/1216 |

FOREIGN PATENT DOCUMENTS

| | | |
|---|---|---|
| CN | 104064139 A | 9/2014 |
| CN | 105702214 A | 6/2016 |
| CN | 107993612 A | 5/2018 |
| CN | 109801596 A | 5/2019 |
| CN | 113160750 A | 7/2021 |
| JP | 2019056911 A | 4/2019 |

OTHER PUBLICATIONS

China Patent Office, CN202110256403.2 Second Office Action dated Sep. 29, 2022.

* cited by examiner

DISPLAY SUBSTRATE, DRIVING METHOD THEREOF AND DISPLAY APPARATUS

CROSS-REFERENCE TO RELATED APPLICATIONS

This is a National Phase Application filed under 35 U.S.C. 371 as a national stage of PCT/CN2021/126887 filed on Oct. 28, 2021, an application claiming priority to Chinese patent application No. 202110256403.2, filed on Mar. 9, 2021, the content of each of which is incorporated herein by reference in its entirety.

TECHNICAL FIELD

The present disclosure relates to the field of display technology, and specifically relates to a display substrate, a driving method thereof, and a display apparatus.

BACKGROUND

As a current-driven display device, an organic light-emitting diode (OLED) has been widely used in display related fields due to the advantages of self-luminescence, fast response, wide viewing angle, capability of being fabricated on a flexible substrate, and the like.

SUMMARY

Some embodiments of the present disclosure provide a display substrate, a driving method of a display substrate, and a display apparatus.

A first aspect of the present disclosure provides a display substrate, including: M rows of pixel circuits and M rows of scan signal lines, where each pixel circuit includes:
- a driving transistor having a first electrode connected to a first power line, and a second electrode connected to a first electrode of a light-emitting device;
- a first storage sub-circuit having a first terminal connected to a gate electrode of the driving transistor;
- a second storage sub-circuit having a first terminal connected to the first power line, and a second terminal connected to the gate electrode of the driving transistor;
- a gating sub-circuit connected to a second terminal of the first storage sub-circuit, where the gating sub-circuit of an $m^{th}$ row of pixel circuit is further connected to an $(m-1)^{th}$ row of scan signal line and an $m^{th}$ row of scan signal line, and the gating sub-circuit is configured to: provide, in response to control of one row of scan signal line of the $(m-1)^{th}$ row of scan signal line and the $m^{th}$ row of scan signal line, a data voltage signal to the second terminal of the first storage sub-circuit, and provide, in response to control of the other row of scan signal line of the $(m-1)^{th}$ row of scan signal line and the $m^{th}$ row of scan signal line, a reference voltage signal to the second terminal of the first storage sub-circuit; and
- a threshold compensation sub-circuit connected to the gate electrode and the second electrode of the driving transistor, where the threshold compensation sub-circuit of the $m^{th}$ row of pixel circuit is further connected to the $(m-1)^{th}$ row of scan signal line, and the threshold compensation sub-circuit is configured to perform, in response to control of the scan signal line connected thereto, threshold compensation on the driving transistor;
where $1 < m \leq M$, and both m and M are positive integers.

Optionally, the gating sub-circuit includes a first gating transistor and a second gating transistor;
- a first electrode of the first gating transistor is connected to a data signal line providing the data voltage signal, a second electrode of the second gating transistor is connected to a reference signal line providing the reference voltage signal, and a second electrode of the first gating transistor and a first electrode of the second gating transistor are both connected to the second terminal of the first storage sub-circuit; and
- in the $m^{th}$ row of pixel circuit, one of a gate electrode of the first gating transistor and a gate electrode of the second gating transistor is connected to the $m^{th}$ row of scan signal line, and the other is connected to the $(m-1)^{th}$ row of scan signal line.

Optionally, the first electrode and the second electrode of the driving transistor, the first electrode and the second electrode of the first gating transistor, and the first electrode and the second electrode of the second gating transistor are disposed in a same layer;
- on a side of the first electrode and the second electrode of the driving transistor distal to a base of the display substrate, a first gate insulation layer, a first gate metal layer, a second gate insulation layer, and a second gate metal layer are sequentially arranged, and the gate electrode of the driving transistor, the gate electrode of the first gating transistor, and the gate electrode of the second gating transistor are each located in the first gate metal layer; and
- the second gate metal layer includes a first connection part having one end connected to the second electrode of the first gating transistor through a first via, and the other end connected to the first electrode of the second gating transistor through a second via, the first via and the second via each penetrating through the first gate insulation layer and the second gate insulation layer.

Optionally, the display substrate further includes a first interlayer dielectric layer disposed on a side of the second gate metal layer distal to the base, and a first source-drain metal layer disposed on a side of the first interlayer dielectric layer distal to the base, wherein the first power line is located in the first source-drain metal layer; and
- the first power line is connected to the first electrode of the driving transistor through a third via which penetrates through the first gate insulation layer, the second gate insulation layer and the first interlayer dielectric layer.

Optionally, the reference signal line is located in the first source-drain metal layer, and connected to the second electrode of the second gating transistor through a fourth via which penetrates through the first gate insulation layer, the second gate insulation layer and the first interlayer dielectric layer.

Optionally, the display substrate further includes a second interlayer dielectric layer disposed on a side of the first source-drain metal layer distal to the base, and a second source-drain metal layer disposed on a side of the second interlayer dielectric layer distal to the base, wherein the data signal line is located in the second source-drain metal layer; and
- the data signal line is connected to the first electrode of the first gating transistor through a fifth via which penetrates through the first gate insulation layer, the second gate insulation layer, the first interlayer dielectric layer, and the second interlayer dielectric layer.

Optionally, the second source-drain metal layer is further provided with a connection member having one end connected to the first electrode of the light-emitting device, and the other end connected to the second electrode of the driving transistor through a sixth via which penetrates through the first gate insulation layer, the second gate insulation layer, the first interlayer dielectric layer, and the second interlayer dielectric layer.

Optionally, the display substrate further includes a planarization layer disposed between the connection member and the first electrode of the light-emitting device, wherein the first electrode of the light-emitting device is connected to the connection member through a seventh via penetrating through the planarization layer.

Optionally, the first storage sub-circuit includes a first capacitor, and the second storage sub-circuit includes a second capacitor; and the gate electrode of the driving transistor forms a one-piece structure with both a second plate of the second capacitor and a first plate of the first capacitor, a first plate of the second capacitor forms a one-piece structure with the first power line, and a second plate of the first capacitor forms a one-piece structure with the first connection part.

Optionally, the threshold compensation sub-circuit includes a threshold compensation transistor, a gate electrode of the threshold compensation transistor in the $m^{th}$ row of pixel circuit is connected to the $(m-1)^{th}$ row of scan signal line, a second electrode of the threshold compensation transistor is connected to the second electrode of the driving transistor, and a first electrode of the threshold compensation transistor is connected to the gate electrode of the driving transistor.

Optionally, the first and second electrodes of the threshold compensation transistor are disposed in the same layer as the first and second electrodes of the driving transistor, and the second gate metal layer further includes a second connection part spaced apart from the first connection part; and one end of the second connection part is connected to the first electrode of the threshold compensation transistor through an eighth via, the other end of the second connection part is connected to the gate electrode of the driving transistor through a ninth via, and the eighth via and the ninth via each penetrate through the first gate insulation layer and the second gate insulation layer.

Optionally, the gate electrode of the first gating transistor in the $m^{th}$ row of pixel circuit is connected to the $m^{th}$ row of scan signal line, and the gate electrode of the second gating transistor in the $m^{th}$ row of pixel circuit is connected to the $(m-1)^{th}$ row of scan signal line; and where the gate electrode of the first gating transistor in the $(m-1)^{th}$ row of pixel circuit, the gate electrode of the second gating transistor in the $m^{th}$ row of pixel circuit, and the gate electrode of the threshold compensation transistor in the $m^{th}$ row of pixel circuit form a one-piece structure.

Optionally, the gate electrode of the second gating transistor in the $m^{th}$ row of pixel circuit, the gate electrode of the first gating transistor in the $(m-1)^{th}$ row of pixel circuit, and the gate electrode of the threshold compensation transistor in the $m^{th}$ row of pixel circuit are arranged along an extending direction of the $(m-1)^{th}$ row of scan signal line.

Optionally, the gate electrode of the first gating transistor in the $m^{th}$ row of pixel circuit is connected to the $(m-1)^{th}$ row of scan signal line, and the gate electrode of the second gating transistor in the $m^{th}$ row of pixel circuit is connected to the $m^{th}$ row of scan signal line; and where the gate electrode of the second gating transistor in the $(m-1)^{th}$ row of pixel circuit, the gate electrode of the first gating transistor in the $m^{th}$ row of pixel circuit, and the gate electrode of the threshold compensation transistor in the $m^{th}$ row of pixel circuit form a one-piece structure.

Optionally, the gate electrode of the threshold compensation transistor in the $m^{th}$ row of pixel circuit, the gate electrode of the second gating transistor in the $(m-1)^{th}$ row of pixel circuit, and the gate electrode of the first gating transistor in the $m^{th}$ row of pixel circuit are arranged along an extending direction of the $(m-1)^{th}$ row of scan signal line.

A second aspect of the present disclosure provides a driving method applied to the display substrate as described above, where the driving method includes:

providing, in a first input phase of the $m^{th}$ row of pixel circuit, a turn-on level signal to the $(m-1)^{th}$ row of scan signal line, and providing a turn-off level signal to the $m^{th}$ row of scan signal line, to allow the gating sub-circuit to provide a first signal to the second terminal of the first storage sub-circuit, and allow the threshold compensation sub-circuit to perform threshold compensation on the driving transistor;

providing, in a second input phase of the $m^{th}$ row of pixel circuit, a turn-off level signal to the $(m-1)^{th}$ row of scan signal line, and providing a turn-on level signal to the $m^{th}$ row of scan signal line, to allow the gating sub-circuit to provide a second signal to the second terminal of the first storage sub-circuit; and providing, in a light-emitting phase of the $m^{th}$ row of pixel circuit, a turn-off level signal to the $(m-1)^{th}$ row of scan signal line and the $m^{th}$ row of scan signal line, respectively, to allow the driving transistor to provide a light-emitting current to the light-emitting device according to a voltage difference between the gate electrode and the first electrode of the driving transistor;

where one of the first signal and the second signal is the data voltage signal, and the other is the reference voltage signal.

A third aspect of the present disclosure provides a display apparatus including the display substrate as described above.

BRIEF DESCRIPTION OF DRAWINGS

Accompanying drawings are provided for further understanding of this disclosure and constitute a part of the specification. Hereinafter, these drawings are intended to explain the present disclosure together with the following specific implementations, but should not be considered as a limitation to the present disclosure. In the drawings:

FIG. 1b is a driving timing diagram of the pixel circuit in FIG. 1a;

DETAIL DESCRIPTION OF EMBODIMENTS

Hereinafter, specific implementations of the present disclosure will be described with reference to the accompanying drawings. It will be appreciated that the specific implementations as set forth herein are merely for the purpose of illustration and explanation of the present disclosure and should not be construed as a limitation thereof.

Unless otherwise defined, technical or scientific terms used in the embodiments of the present disclosure are intended to have general meanings as understood by those of ordinary skill in the art. The words "first", "second" and similar terms used in the present disclosure do not denote any order, quantity, or importance, but are used merely for distinguishing different components from each other. Similarly, the word "comprising" or "comprises" or the like means that the element or item preceding the word includes elements or items that appear after the word or equivalents thereof, but does not exclude other elements or items. The terms "connected" or "coupled" and the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may also be changed accordingly.

Figure 1A:
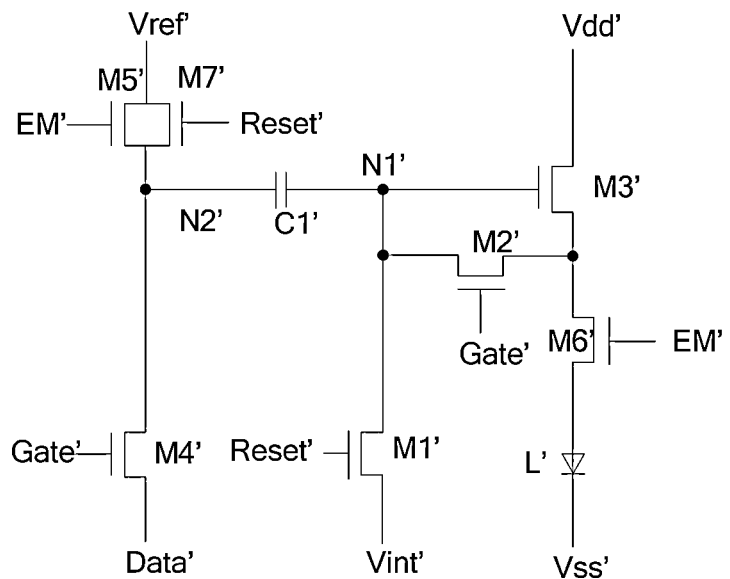
FIG. 1a is an equivalent circuit diagram of a pixel circuit in an example.

FIG. 1a is an equivalent circuit diagram of a pixel circuit in an example. As shown in FIG. 1a, the pixel circuit includes: a first reset transistor M1', a compensation transistor M2', a driving transistor M3', a data write transistor M4', a first light-emitting control transistor M5', a second light-emitting control transistor M6', a second reset transistor M7', and a first capacitor C1'. The first reset transistor M1' has a gate electrode connected to a reset signal line Reset', a first electrode connected to a first signal terminal Vint', and a second electrode connected to a first node N1'. The compensation transistor M2' has a gate electrode connected to a scan signal line Gate', a first electrode connected to a second electrode of the driving transistor M3', and a second electrode connected to the first node N1'. The driving transistor M3' has a gate electrode connected to the first node N1', a first electrode connected to a first voltage terminal Vdd', and a second electrode connected to a first electrode of the second light-emitting control transistor M6'. The data write transistor M4' has a gate electrode connected to the scan signal line Gate', a first electrode connected to a data signal terminal Data', and a second electrode connected to a second node N2'. The first light-emitting control transistor M5' has a gate electrode connected to a light-emitting control signal line EM', a first electrode connected to a second signal terminal Vref', and a second electrode connected to the second node N2'. The second light-emitting control transistor M6' has a gate electrode connected to the light-emitting control signal line EM', and a second electrode connected to a first electrode of a light-emitting device L'. A second electrode of the light-emitting device L' is connected to a second voltage terminal Vss'. The second reset transistor M7' has a gate electrode connected to the reset signal line Reset', a first electrode connected to the second signal terminal Vref', and a second electrode connected to the second node N2'. The first capacitor C1' has one terminal connected to the first node N1', and the other terminal connected to the second node N2'.

Figure 1B:
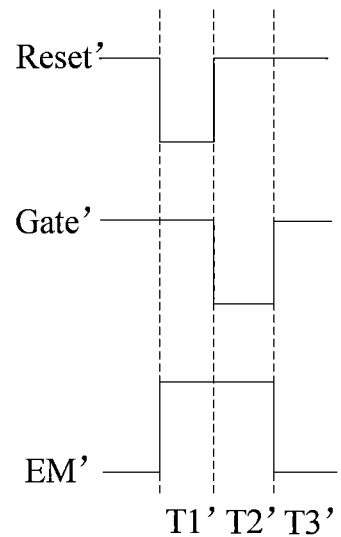

FIG. 1B is a driving timing diagram of the pixel circuit in FIG. 1a. As shown in FIG. 1B, in a reset phase T1', a turn-on level signal (which may also be referred to as an active level signal) is provided to the reset signal line Reset', and both the first reset transistor M1' and the second reset transistor M7' are turned on. Then, the first node N1' has a voltage V1', the second node N2' has a voltage V2', where V1' is the voltage at the first signal terminal Vint', and V2' is the voltage at the second signal terminal Vref'.

In a data write phase T2', a turn-off level signal (which may also be referred to as an inactive level signal) is provided to the reset signal line Reset', a turn-on level signal is provided to the scan signal line Gate', both the first reset transistor M1' and the second reset transistor M7' are turned off, and both the compensation transistor M2' and the data write transistor M4' are turned on. At this time, the first node N1' has a voltage V3'+Vth', the second node N2' has a voltage V4', where V3' is the voltage at the first voltage terminal Vdd', Vth' is a threshold voltage of the driving transistor M3', and V4' is the voltage at the data signal terminal Data'.

In a light-emitting control phase T3', a turn-off level signal is provided to the scan signal line Gate', a turn-on level signal is provided to the light-emitting control signal line EM', both the compensation transistor M2' and the data write transistor M4' are turned off, and both the first light-emitting control transistor M5' and the second light-emitting control transistor M6' are turned on. At this time, the first node N1' has a voltage V3'+Vth'+V2'−V4', and the second node N2' has a voltage V2'. According to a voltage difference between the first node N1' and the second node N2', the driving transistor M3' supplies a driving current I to the light-emitting device L', I=½*k*(V3'+Vth'+V2'−V4'−V2'−Vth')^2=½*k*(V3'−V4')^2, where k is a constant.

As shown in FIG. 1a, in the pixel circuit as described above, a relatively large number of (7) transistors and a relatively large number of driving signal lines (including the reset signal lines, the scan signal lines, and light-emitting control signal lines) are provided, resulting in a complicated structure and making it difficult to realize high pixels per inch (PPI).

In view of this, an embodiment of the present disclosure provides a display substrate, including M rows of scan signal lines and N columns of data signal lines crossing over each other to define M rows and N columns of display units. In an embodiment of the present disclosure, an $m^{th}$ row of display units are connected to an $(m-1)^{th}$ row of scan signal line (which is the scan signal line in the $(m-1)^{th}$ row, and may be referred to as an $(m-1)^{th}$ row scan signal line) and an $m^{th}$ row of scan signal line (which is the scan signal line in the $m^{th}$ row, and may be referred to as an $m^{th}$ row scan signal line). An $n^{th}$ column of display unit (which is the display unit in the $n^{th}$ column, and may be referred to as an $n^{th}$ column display unit) is connected to an $n^{th}$ column of data signal line (which is the data signal line in the $n^{th}$ column, and may be referred to as an $n^{th}$ column data signal line). The M rows of scan signal lines are connected to a gate driver circuit, and the N columns of data signal lines are connected to a source driver circuit. The source driver circuit supplied data voltage signals to the N columns of data signal lines, and the gate driver circuit sequentially supplies turn-on level signals to the M rows of scan signal lines, where 1<m≤M, and m and M are positive integers, and 1<n≤N, and n and N are positive integers.

Figure 2A:
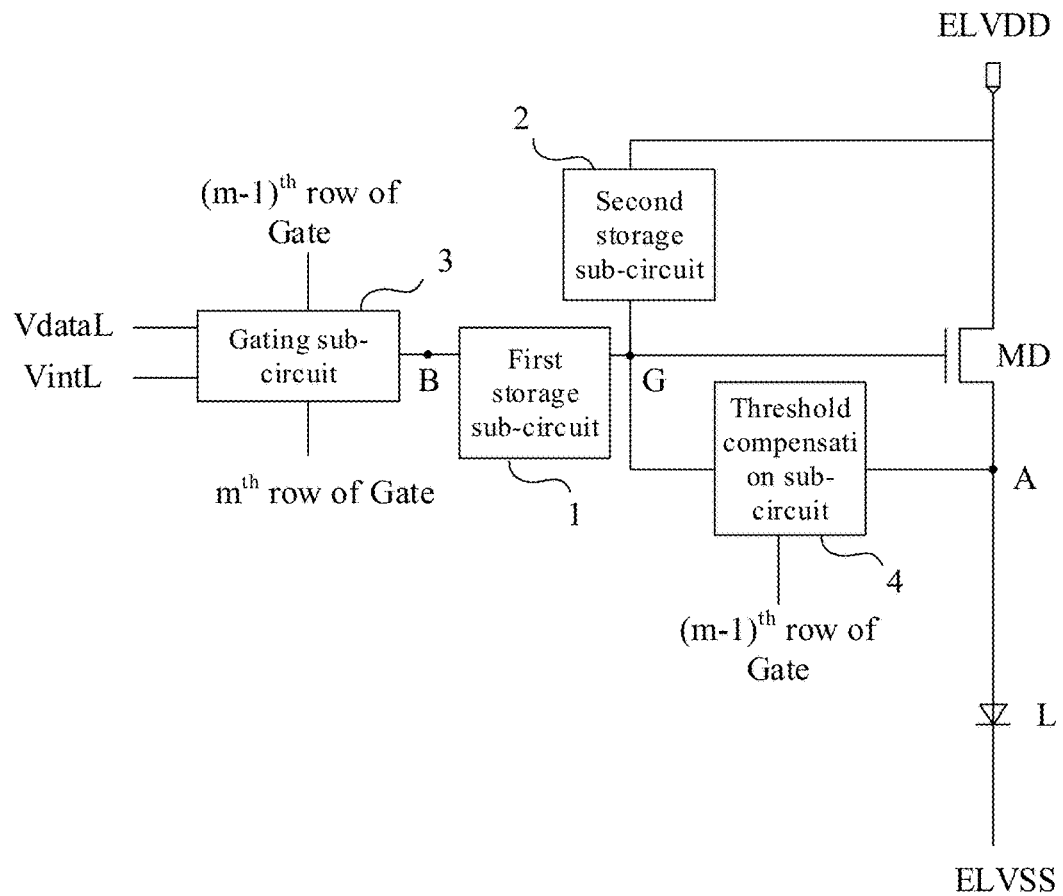
FIG. 2a is a schematic diagram of functional modules in a pixel circuit according to an embodiment of the present disclosure.

FIG. 2a is a schematic diagram of functional modules in a pixel circuit according to an embodiment of the present disclosure. As shown in FIG. 2a, each display unit includes a light-emitting device L and a pixel circuit configured to provide a driving current to the light-emitting device L. The pixel circuit includes: a driving transistor MD, a first storage sub-circuit 1, a second storage sub-circuit 2, a gating sub-circuit 3, and a threshold compensation sub-circuit 4. The driving transistor MD has a first electrode connected to a first power line ELVDD, and a second electrode connected to a first electrode of the light-emitting device L (at node A in FIG. 2a); and a second electrode of the light-emitting device L is connected to a second power line ELVSS. A first terminal of the first storage sub-circuit 1 is connected to a gate electrode of the driving transistor MD. A first terminal of the second storage sub-circuit 2 is connected to the first power line ELVDD, and a second terminal of the second storage sub-circuit 2 is connected to the gate electrode of the driving transistor MD (at node G in FIG. 2a). The gating sub-circuit 3 is connected to a second terminal of the first storage sub-circuit 1 (at node B in FIG. 2a), and the gating sub-circuit 3 of an $m^{th}$ row of pixel circuit is further connected to an $(m-1)^{th}$ row of scan signal line Gate and an $m^{th}$ row of scan signal line Gate. The gating sub-circuit 3 is configured to: provide, in response to control of one row of scan signal line Gate, a data voltage signal Vdata to the second terminal of the first storage sub-circuit 1, and provide, in response to control of the other row of scan signal line Gate, a reference voltage signal Vint to the second terminal of the first storage sub-circuit 1. The threshold compensation sub-circuit 4 is connected to the gate electrode and the second electrode of the driving transistor MD. The threshold compensation sub-circuit 4 of the $m^{th}$ row of pixel circuit is further connected to the $(m-1)^{th}$ row of scan signal line Gate, and the threshold compensation sub-circuit 4 is configured to perform, in response to control of the scan signal line Gate connected thereto, threshold compensation on the driving transistor MD.

In an embodiment of the present disclosure, the first storage sub-circuit 1 may include a first capacitor, and the second storage sub-circuit 2 may include a second capacitor. The first capacitor has a first plate connected to the gate electrode of the driving transistor MD, and a second plate connected to the gating sub-circuit 3. The second capacitor has a first plate connected to the first power line ELVDD, and a second plate connected to the gate electrode of the driving transistor MD. The gating sub-circuit 3 may be configured to provide, in response to control of the $(m-1)^{th}$ row of scan signal line Gate, a reference voltage signal Vint to the second terminal of the first storage sub-circuit 1; and provide, in response to control of the $m^{th}$ row of scan signal line Gate, a data voltage signal Vdata to the second terminal of the first storage sub-circuit 1; or may be configured to provide, in response to control of the $(m-1)^{th}$ row of scan signal line Gate, a data voltage signal Vdata to the second terminal of the first storage sub-circuit 1; and provide, in response to control of the $m^{th}$ row of scan signal line Gate, a reference voltage signal Vint to the second terminal of the first storage sub-circuit 1.

As can be seen, in the pixel circuit according to the embodiment of the present disclosure, the gating sub-circuit 3 and the threshold compensation sub-circuit 4 are both controlled by scan signal lines Gate, and compared with the pixel circuit shown in FIG. 1a, the reset signal line Reset' and the light-emitting control signal line EM' in FIG. 1a are omitted in the embodiment of the present disclosure, thereby simplifying the structure of the pixel circuit, and facilitating implementation of the high PPI design.

Figure 2B:
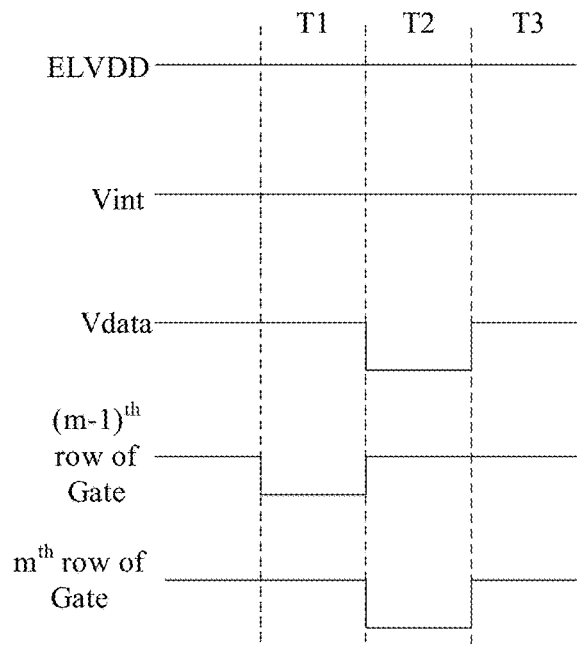
FIG. 2b is a first driving timing diagram of a pixel circuit according to an embodiment of the present disclosure.

FIG. 2b is a first driving timing diagram of a pixel circuit according to an embodiment of the present disclosure. As shown in FIGS. 2a and 2b, in an embodiment of the present disclosure, an operating process of the pixel circuit includes a first input phase T1, a second input phase T2, and a light-emitting phase T3. In the first input phase T1, the gating sub-circuit 3 may provide a first signal to the second terminal of the first storage sub-circuit 1, and in the second input phase T2, the gating sub-circuit 3 may provide a second signal to the second terminal of the first storage sub-circuit 1. One of the first signal and the second signal is the data voltage signal Vdata, and the other is the reference voltage signal Vint. The operating process of the $m^{th}$ row of pixel circuit will be described below with the first signal being the data voltage signal Vdata and the second signal being the reference voltage signal Vint as an example.

Specifically, in the first input phase T1 of the $m^{th}$ row of pixel circuit, a turn-on level signal is provided to the $(m-1)^{th}$ row of scan signal line Gate, and a turn-off level signal is provided to the $m^{th}$ row of scan signal line Gate, so that the gating sub-circuit 3 provides the reference voltage signal Vint to the second terminal of the first storage sub-circuit 1 to initialize a voltage at the second terminal of the first storage sub-circuit 1. The threshold compensation sub-circuit 4 may electrically connect the gate electrode and the second electrode of the driving transistor MD to each other, thereby performing threshold compensation on the driving transistor MD.

At this time, node B has a voltage Vint, node G has a voltage ELVDD'+Vth, where ELVDD' is the voltage supplied by the first power line ELVDD, and Vth is a threshold voltage of the driving transistor MD. In the second input phase T2 of the $m^{th}$ row of pixel circuit, a turn-off level signal is provided to the $(m-1)^{th}$ row of scan signal line Gate, and a turn-on level signal is provided to the $m^{th}$ row of scan signal line Gate, so that the gating sub-circuit 3 provides the data voltage signal Vdata to the second terminal of the first storage sub-circuit 1.

At this time, node B has a voltage Vdata, node G has a voltage ELVDD'+Vth+(Vdata−Vint)*(C1'/(C1'+C2')), where C1' is the capacitance of the first capacitor, and C2' is the capacitance of the second capacitor.

In the light-emitting phase T3 of the $m^{th}$ row pixel circuit, a turn-off level signal is provided to the $(m-1)^{th}$ row of scan signal line Gate and the $m^{th}$ row of scan signal line Gate, respectively, so that the driving transistor MD provides a light-emitting current to the light-emitting device L according to a voltage difference between the gate electrode and the first electrode of the driving transistor MD.

At this time, node G has a voltage ELVDD'+Vth+(Vdata−Vint)*(C1'/(C1'+C2')), and the gate electrode and the first electrode of the driving transistor MD have therebetween a voltage difference Vgs=Vth+(Vdata−Vint)*(C1'/(C1'+C2')). The light-emitting current I=K*((Vdata−Vint)*(C1'/(C1'+C2')))², where K is a constant. As can be seen, the light-emitting current I is related to the data voltage signal Vdata and independent of the threshold voltage Vth, so that the pixel circuit can generate corresponding light-emitting currents according to different data voltage signals Vdata, and will not be influenced by a drift of the threshold voltage.

The specific structure of the pixel circuit according to an embodiment of the present disclosure will be further described below with reference to FIGS. 2a to 8m, and it should be noted that, in the embodiment of the present disclosure, each transistor may be a thin film transistor or field effect transistor, or any other switch device with the same characteristics as those of the thin film transistor or field effect transistor. Each transistor generally includes three electrodes: a gate electrode, a source electrode, and a drain electrode. The source electrode and the drain electrode of each transistor are symmetrical in structure, and may be exchanged as desired. In an embodiment of the present disclosure, one of the first electrode and the second electrode is the source electrode, and the other is the drain electrode.

Further, according to characteristics of the transistors, transistors may be classified as N-type transistors and P-type transistors. In the present disclosure, an "active level signal" or "turn-on level signal" (or "active level potential" or "turn-on level potential") refers to a voltage signal (or potential) capable of controlling a corresponding transistor to be turned on, and an "inactive level signal" or "turn-off level signal" (or "inactive level potential" or "turn-off level potential") refers to a voltage signal (or potential) capable of controlling a corresponding transistor to be turned off. Therefore, when the transistor is an N-type transistor, the turn-on level signal is a high level signal, and the turn-off level signal is a low level signal. When the transistor is a P-type transistor, the turn-on level signal is a low level signal, and the turn-off level signal is a high level signal. The embodiments of the present disclosure are described by taking the transistors being P-type transistors as an example.

Figure 3:
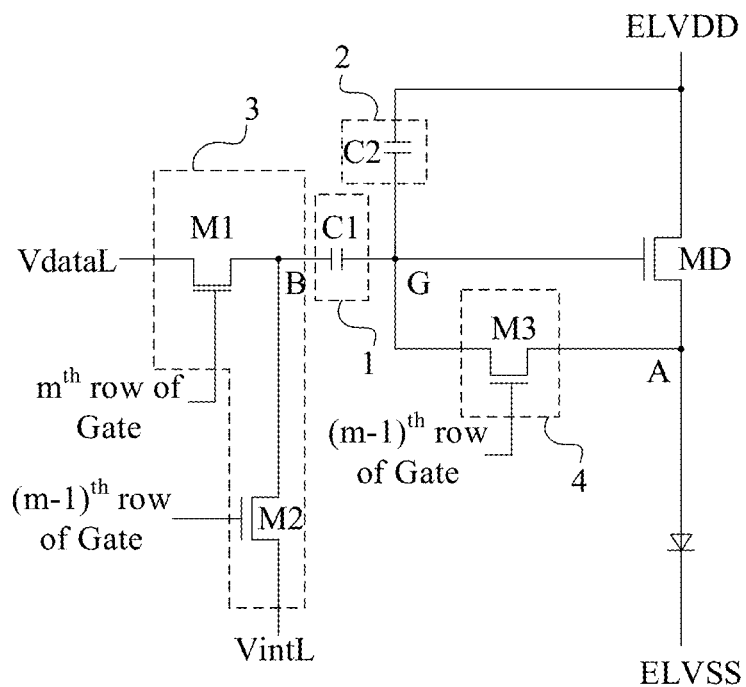
FIG. 3 is a first schematic diagram showing a specific structure of a pixel circuit according to an embodiment of the present disclosure.

FIG. 3 is a first schematic diagram showing a specific structure of a pixel circuit according to an embodiment of the present disclosure. In some embodiments, as shown in FIG. 3, the gating sub-circuit 3 includes a first gating transistor M1 and a second gating transistor M2. A first electrode of the first gating transistor M1 is connected to a data signal line VdataL providing the data voltage signal Vdata, a second electrode of the second gating transistor M2 is connected to a reference signal line VintL providing the reference voltage signal Vint, and a second electrode of the first gating transistor M1 and a first electrode of the second gating transistor M2 are both connected to the second terminal of the first storage sub-circuit 1. In the $m^{th}$ row of pixel circuit, one of a gate electrode of the first gating transistor M1 and a gate electrode of the second gating transistor M2 is connected to the $m^{th}$ row of scan signal line Gate, and the other is connected to the $(m-1)^{th}$ row of scan signal line Gate.

For example, in some specific embodiments, the gate electrode of the first gating transistor M1 in the $m^{th}$ row of pixel circuit is connected to the $m^{th}$ row of scan signal line Gate, and the gate electrode of the second gating transistor M2 in the $m^{th}$ row of pixel circuit is connected to the $(m-1)^{th}$ row of scan signal line Gate. In some other specific embodiments, the gate electrode of the first gating transistor M1 in the $m^{th}$ row of pixel circuit is connected to the $(m-1)^{th}$ row of scan signal line Gate, and the gate electrode of the second gating transistor M2 in the $m^{th}$ row of pixel circuit is connected to the $m^{th}$ row of scan signal line Gate.

In some specific embodiments, the threshold compensation sub-circuit 4 includes a threshold compensation transistor M3, the gate electrode of the threshold compensation transistor M3 in the $m^{th}$ row of pixel circuit is connected to the $(m-1)^{th}$ row of scan signal line Gate, a second electrode of the threshold compensation transistor M3 is connected to the second electrode of the driving transistor MD, and a first electrode of the threshold compensation transistor M3 is connected to the gate electrode of the driving transistor MD.

Figure 4A:
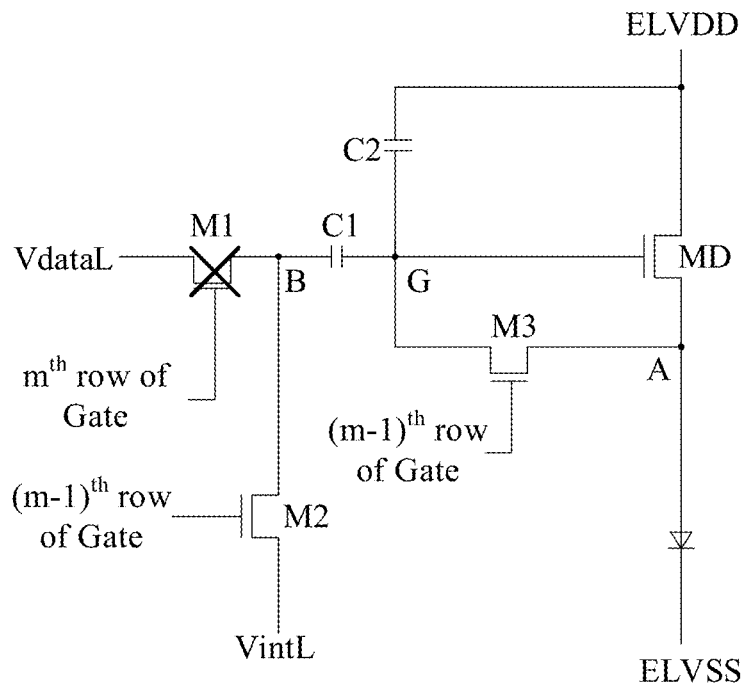
FIGS. 4a to 4c are schematic diagrams showing respective transistors in an operating state according to an embodiment of the present disclosure.
Figure 4B:
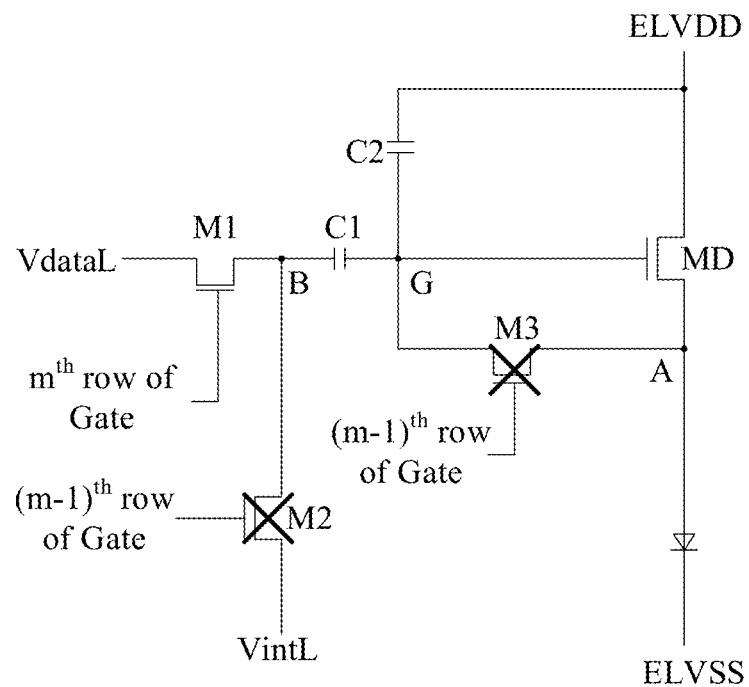
Figure 4C:
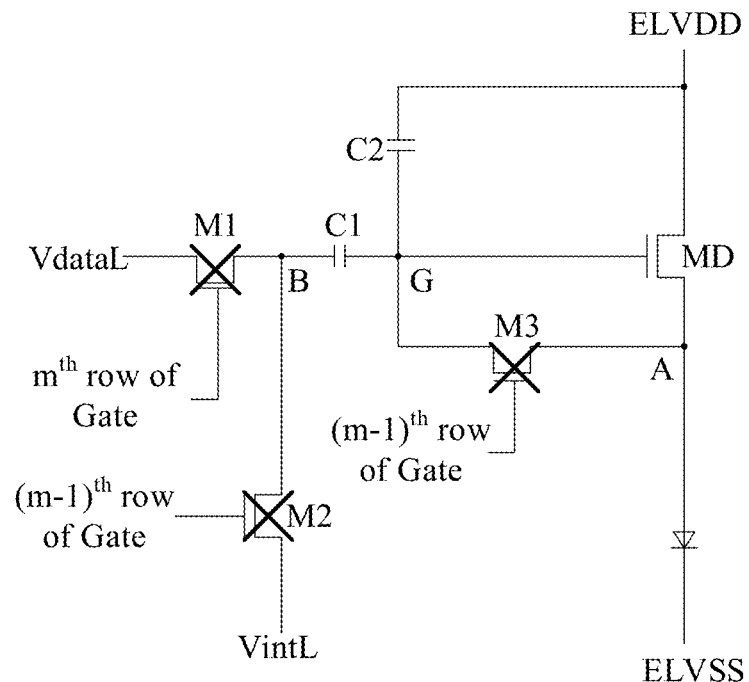
Figure 5A:
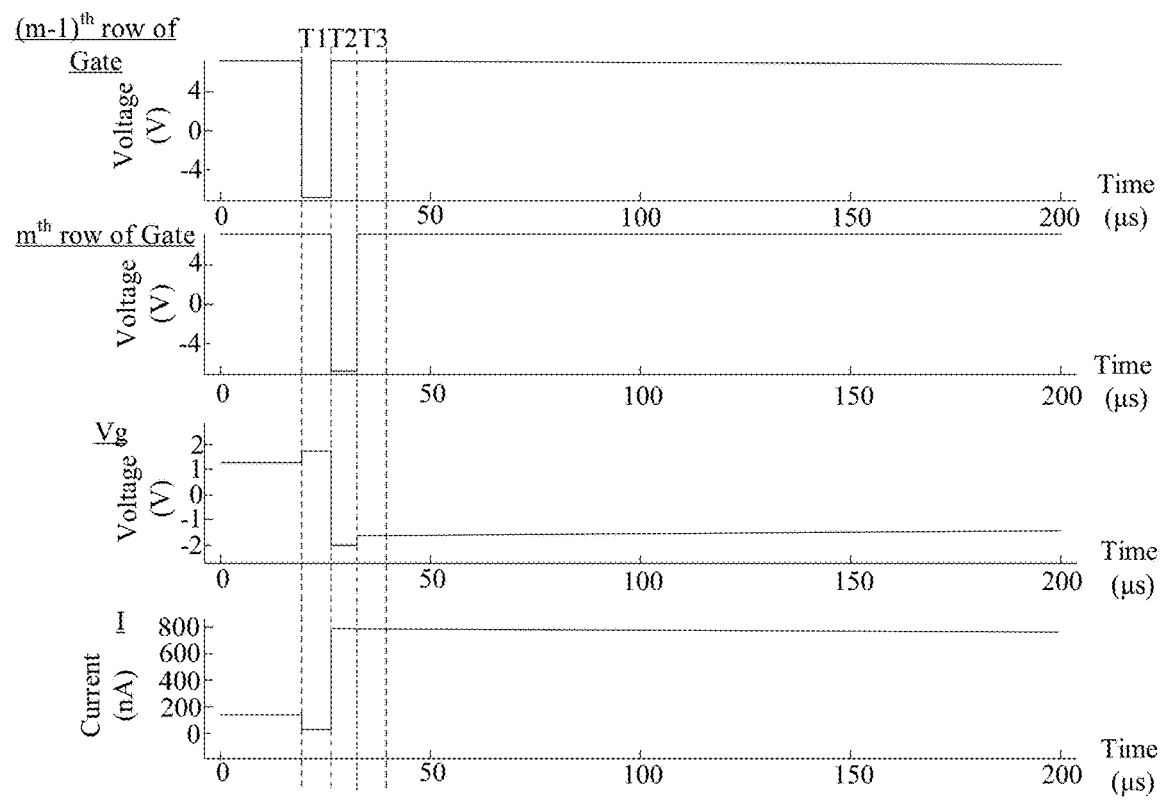
FIGS. 5a to 5d are simulation diagrams of a pixel circuit operated under different data voltage signals according to an embodiment of the present disclosure.
Figure 5B:
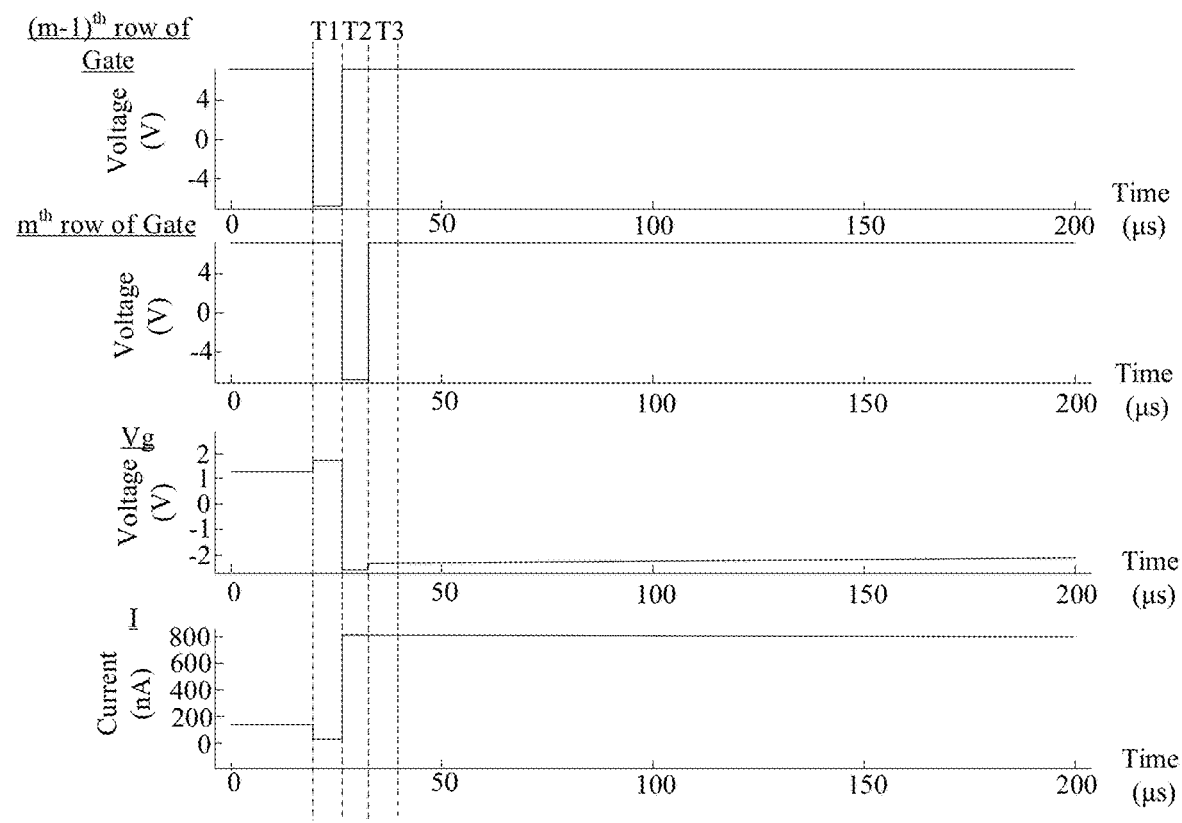
Figure 5C:
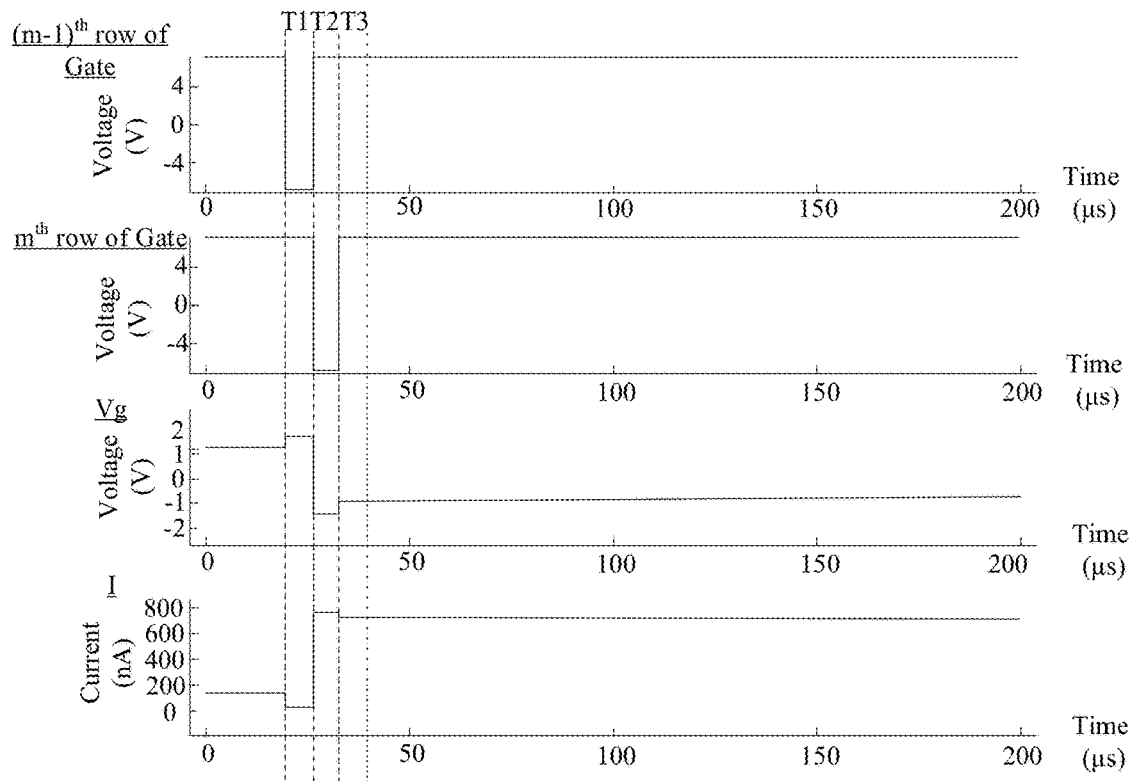
Figure 5D:
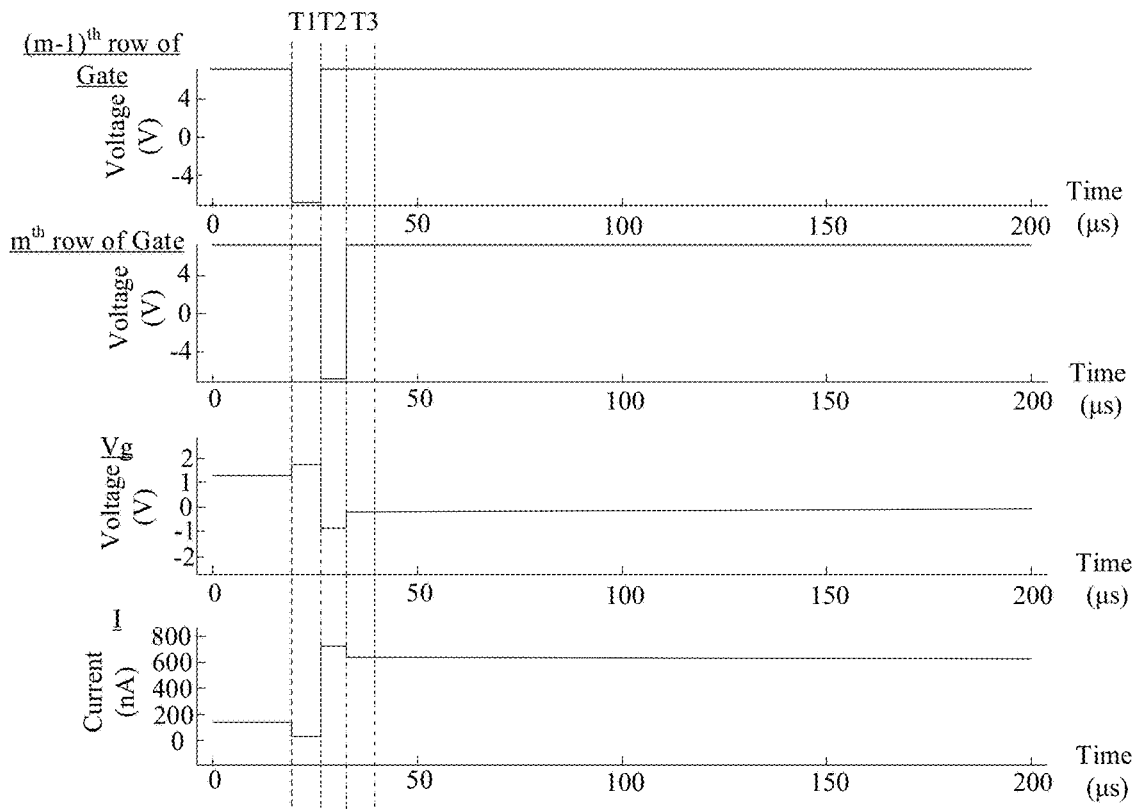

FIGS. 4a to 4c are schematic diagrams showing respective transistors in an operating state according to an embodiment of the present disclosure. Referring to FIGS. 3 to 4c, the operating process in a case where the gate electrode of the first gating transistor M1 in the $m^{th}$ row of pixel circuit is connected to the $m^{th}$ row of scan signal line Gate, and the gate electrode of the second gating transistor M2 in the $m^{th}$ row of pixel circuit is connected to the $(m-1)^{th}$ row of scan signal line Gate according to an embodiment of the present disclosure is firstly explained in details below.

In the first input phase T1 of the $m^{th}$ row of pixel circuit, a turn-on level signal is provided to the $(m-1)^{th}$ row of scan signal line Gate, and a turn-off level signal is provided to the $m^{th}$ row of scan signal line Gate. At this time, as shown in FIG. 4a, the second gating transistor M2 and the threshold compensation transistor M3 are turned on, node B has a voltage Vint, the first power line ELVDD makes electricity leaked to node G through the driving transistor MD and the threshold compensation transistor M3, and the driving transistor MD is turned off until the voltage at node G reaches ELVDD'+Vth.

In the second input phase T2 of the $m^{th}$ row of pixel circuit, a turn-off level signal is provided to the $(m-1)^{th}$ row of scan signal line Gate, and a turn-on level signal is provided to the $m^{th}$ row of scan signal line Gate. At this time, as shown in FIG. 4b, the second gating transistor M2 and the threshold compensation transistor M3 are turned off, the first gating transistor M1 is turned on, the voltage at node B jumps from Vint to Vdata, and the voltage at node G jumps to ELVDD'+Vth+(Vdata−Vint)*(C1'/(C1'+C2')).

In the light-emitting phase T3 of the $m^{th}$ row pixel circuit, a turn-off level signal is provided to the $(m-1)^{th}$ row of scan signal line Gate and the $m^{th}$ row of scan signal line Gate, respectively. At this time, as shown in FIG. 4c, the first gating transistor M1 is turned off, the voltage at node G remains at ELVDD'+Vth+(Vdata−Vint)*(C1'/(C1'+C2')), where Vdata<Vint, and Vgs−Vth=(Vdata−Vint)*(C1'/(C1'+C2'))<0, so that the driving transistor MD is turned on, and supplies the light-emitting current I to the light-emitting device L.

FIGS. 5a to 5d are simulation diagrams of a pixel circuit operated under different data voltage signals according to an embodiment of the present disclosure. As shown in FIGS. 5a to 5d, when the pixel circuit is operated under different data voltage signals, a voltage Vg at the gate electrode of the driving transistor MD and the light-emitting current I can both meet the operating requirement.

FIGS. 6a to 6m are first plan views of various film layers in a pixel circuit according to an embodiment of the present disclosure. A planar structure of the pixel circuit in the embodiment of the present disclosure will be described below with reference to FIGS. 6a to 6m. In an embodiment of the present disclosure, the pixel circuit includes a base, and a semiconductor layer Poly, a first gate insulation layer (not shown), a first gate metal layer Gate1, a second gate insulation layer GI, a second gate metal layer Gate2, a first interlayer dielectric layer IDL1, a first source-drain metal layer SD1, a second interlayer dielectric layer IDL2, a second source-drain metal layer SD2, and a planarization layer PLN sequentially arranged in a direction away from the base.

Figure 6A:
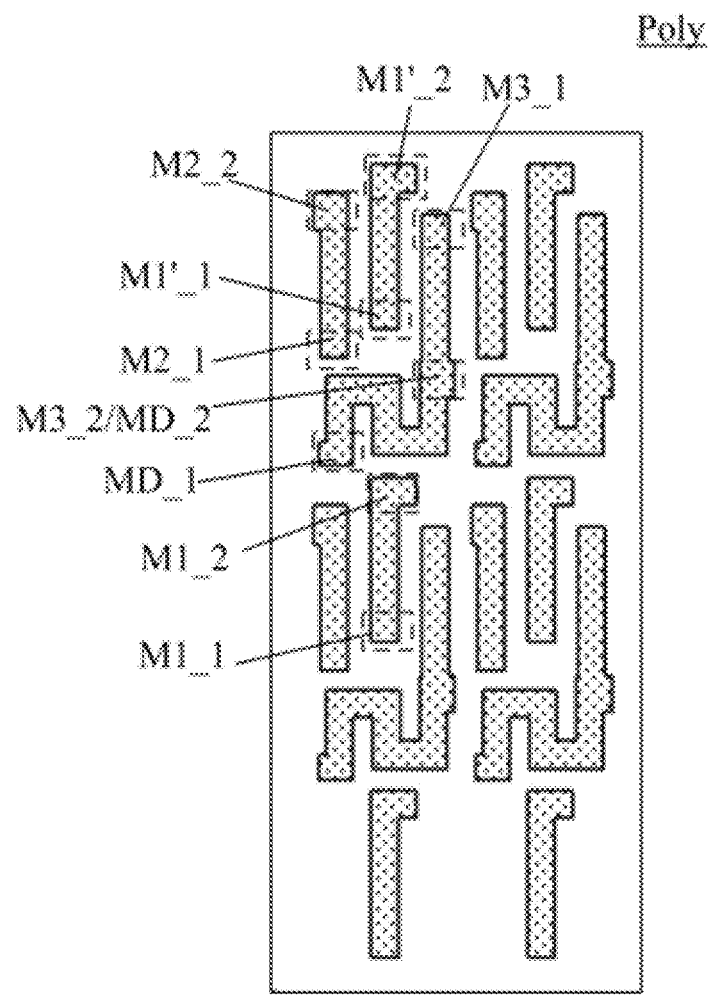
FIGS. 6a to 6m are first plan views of various film layers in a pixel circuit according to an embodiment of the present disclosure.

FIG. 6a is a first schematic diagram of a semiconductor layer according to an embodiment of the present disclosure, in which M1_1 denotes a first electrode of the first gating transistor M1 in the $m^{th}$ row of pixel circuit, M1_2 denotes a second electrode of the first gating transistor M1 in the $m^{th}$ row of pixel circuit, M1'_1 denotes a first electrode of the first gating transistor M1 in the $(m-1)^{th}$ row of pixel circuit, and M1'_2 denotes a second electrode of the first gating transistor M1 in the $(m-1)^{th}$ row of pixel circuit. As shown in FIG. 6a, the first electrode MD_1 and the second electrode MD_2 of the driving transistor MD, the first electrodes M1_1 (M1'_1) and the second electrodes M1_2 (M1'_2) of the first gating transistors M1, the first electrode M2_1 and the second electrode M2_2 of the second gating transistor M2, and the first electrode M3_1 and the second electrode M3_2 of the threshold compensation transistor M3 are disposed in a same layer and each located in the semiconductor layer Poly. The second electrode MD_2 of the driving transistor MD and the first electrode M3_1 of the threshold compensation transistor M3 may be connected to each other to form a one-piece structure. The semiconductor layer Poly may be made of a material including polysilicon or metal oxide, which is not specifically limited in the embodiments of the present disclosure. The first electrode MD_1 and the second electrode MD_2 of the driving transistor MD, the first electrodes M1_1 (M1'_1) and the second electrodes M1_2 (M1'_2) of the first gating transistors M1, the first electrode M2_1 and the second electrode M2_2 of the second gating transistor M2, and the first electrode M3_1 and the second electrode M3_2 of the threshold compensation transistor M3 each may be formed by doping the semiconductor layer Poly with ions.

In the embodiments of the present disclosure, "being disposed in a same layer" means that two or more structures are formed by a same material layer through a patterning process, so the two or more structures are in a same layer in the layered relationship, but it does not mean that the two or more structures each have a same distance to the base.

Figure 6B:
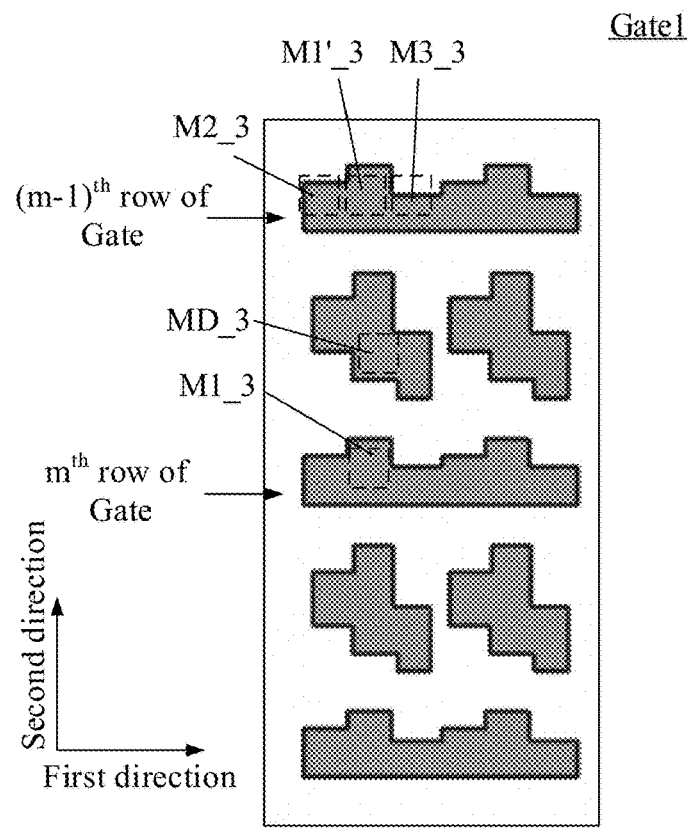

FIG. 6b is a first schematic structural diagram of a first gate metal layer according to an embodiment of the present disclosure. As shown in FIG. 6b, the gate electrode MD_3 of the driving transistor MD, the gate electrodes M1_3 (M1'_3) of the first gating transistors M1, the gate electrode M2_3 of the second gating transistor M2, the gate electrode M3_3 of the threshold compensation transistor M3, and the scan signal line Gate are disposed in a same layer and each located in the first gate metal layer Gate1. Optionally, the first gate metal layer Gate1 may be made of a metal material such as silver, aluminum, molybdenum, copper, or the like, which is not specifically limited in the embodiments of the present disclosure. The first gate metal layer Gate1 is insulated and separated from the semiconductor layer Poly by the first gate insulation layer, and the first gate insulation layer may be a single-layer or multi-layer structure including a silicon nitride layer, a silicon oxide layer, or a silicon oxynitride layer.

In some specific embodiments, the gate electrode M1'_3 of the first gating transistor M1 in the $(m-1)^{th}$ row of pixel circuit, the gate electrode M2_3 of the second gating transistor M2 in the $m^{th}$ row of pixel circuit, and the gate electrode M3_3 of the threshold compensation transistor M3 in the $m^{th}$ row of pixel circuit form a one-piece structure. In an embodiment of the present disclosure, the gate electrodes of the just-mentioned three transistors may form a one-piece structure with the $(m-1)^{th}$ row of scan signal line Gate, so as to further simplify the structure of the pixel circuit.

In some specific embodiments, the scan signal line Gate extends in the first direction shown in FIG. 6b, and the gate electrode M2_3 of the second gating transistor M2 in the $m^{th}$ row of pixel circuit, the gate electrode M1'_3 of the first gating transistor M1 in the $(m-1)^{th}$ row of pixel circuit, and the gate electrode M3_3 of the threshold compensation transistor M3 in the $m^{th}$ row of pixel circuit are arranged along an extending direction of the scan signal line Gate.

Figure 6C:
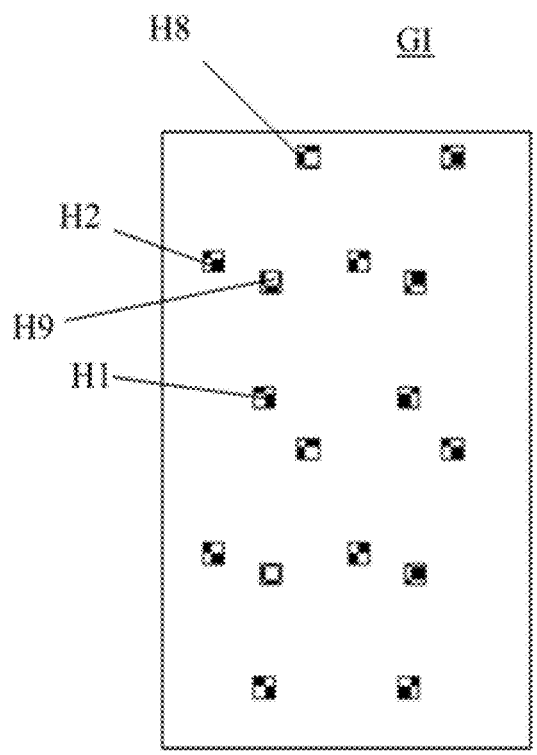
Figure 6D:
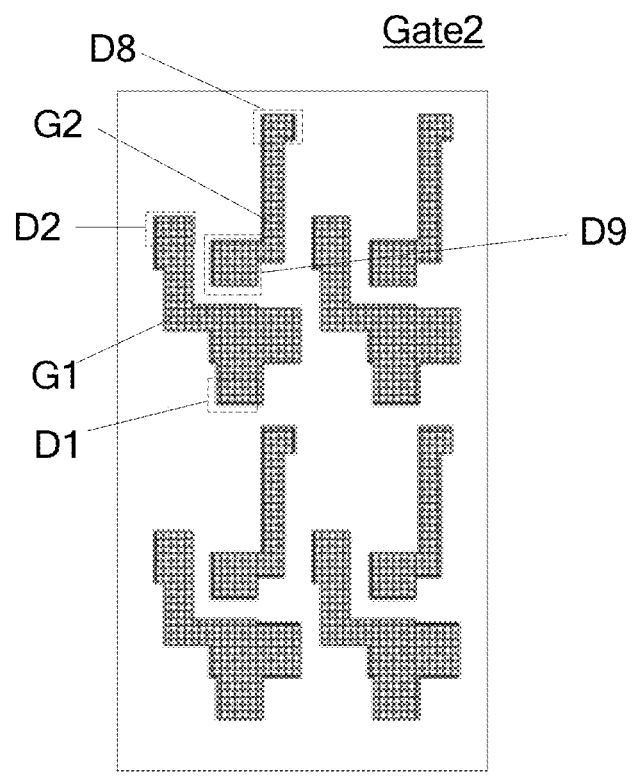
Figure 6E:
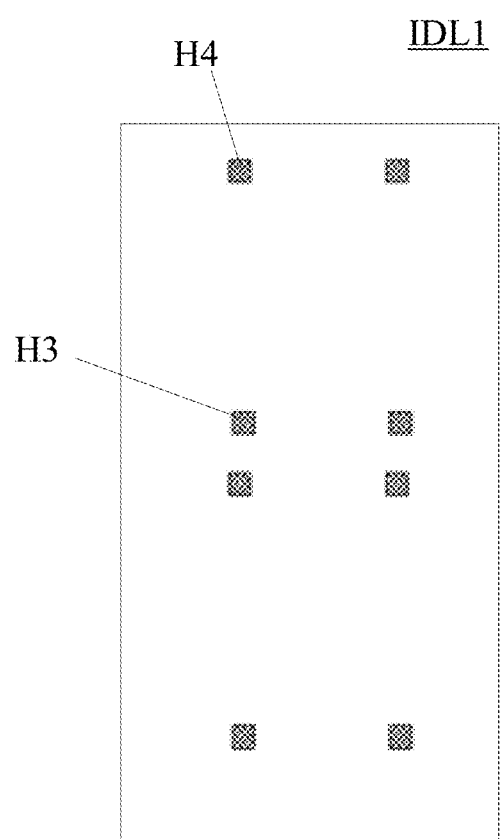
Figure 6F:
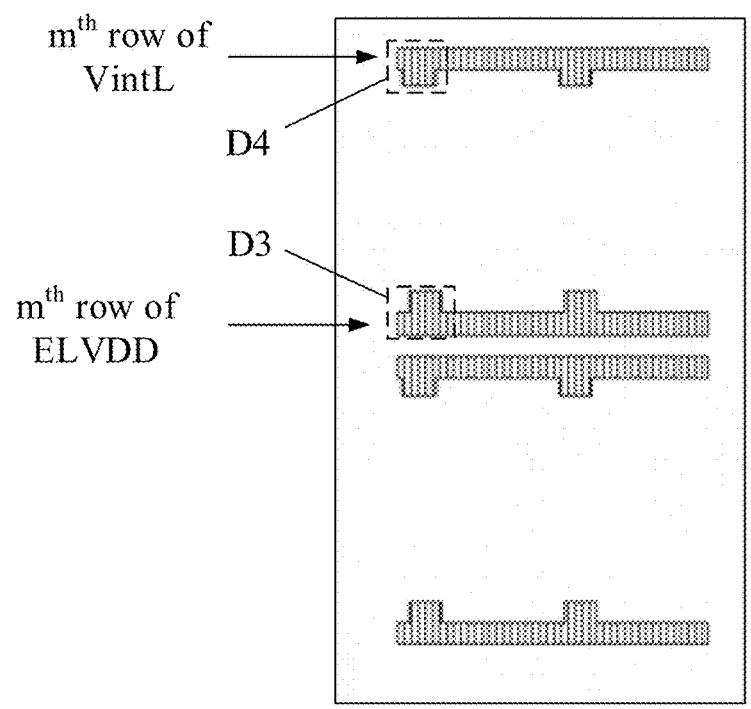
Figure 6G:
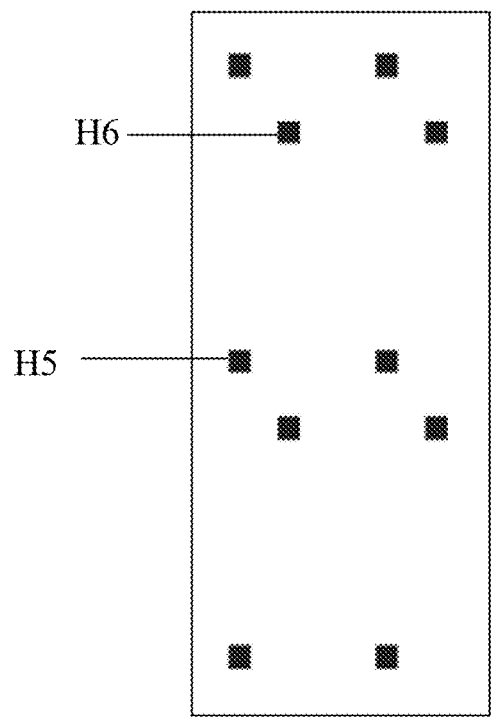
Figure 6H:
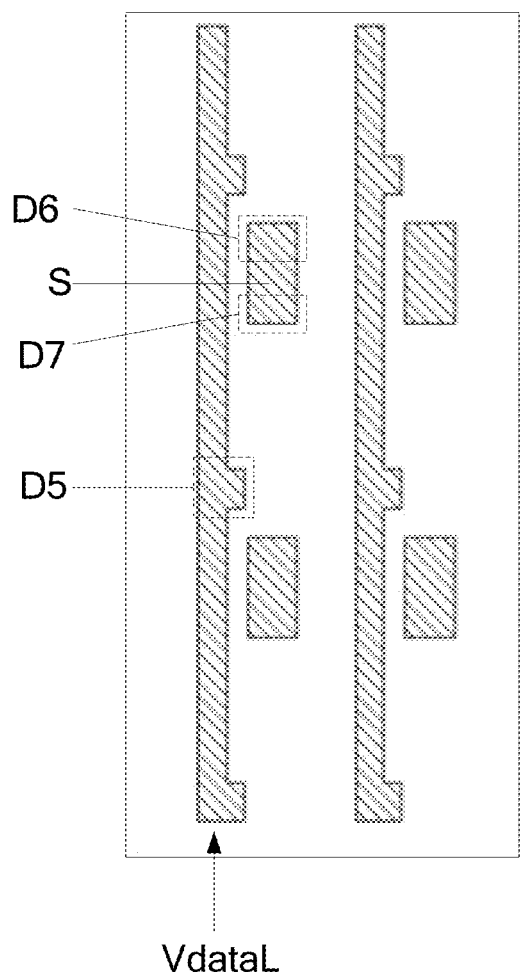
Figure 6I:
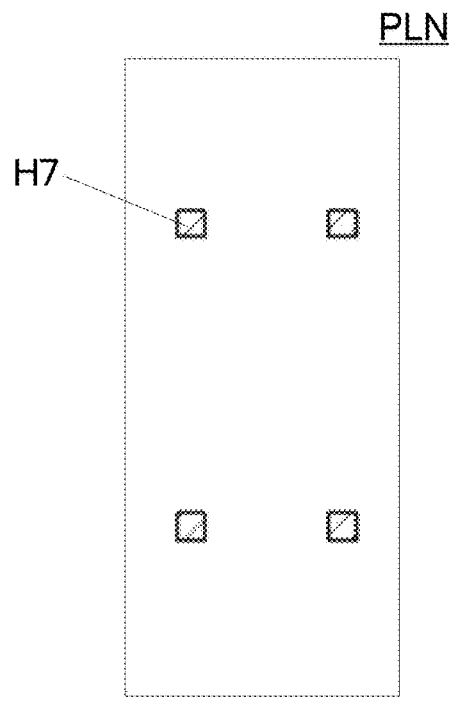
Figure 6J:
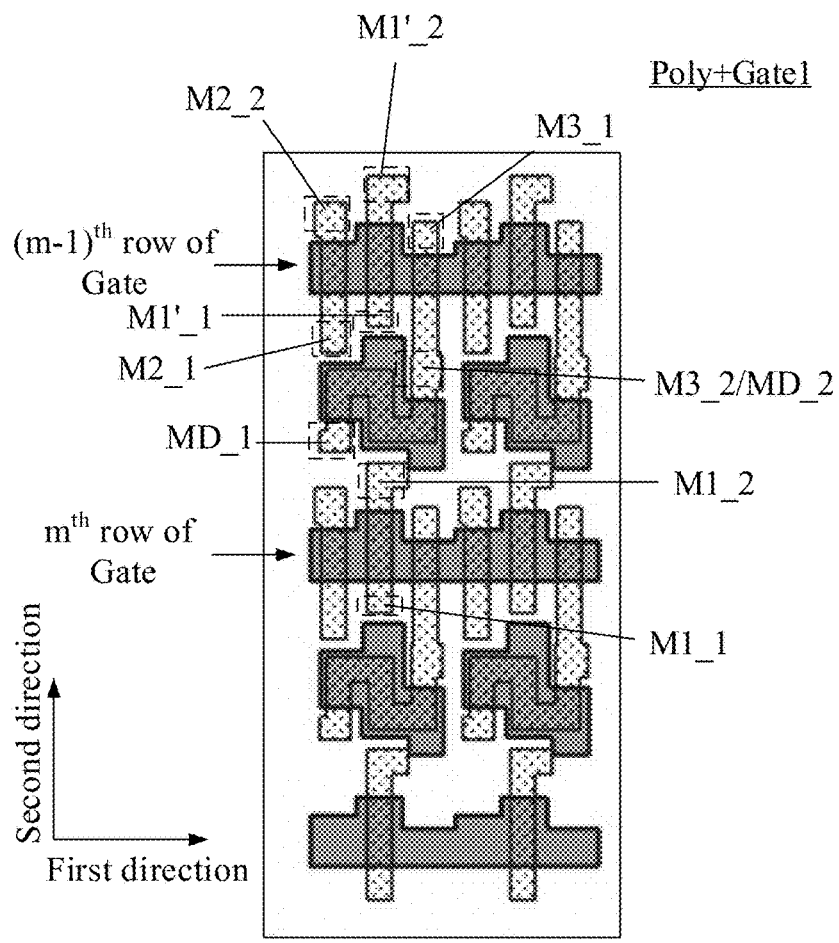

FIG. 6j is a schematic diagram of the film layers shown in FIGS. 6a and 6b and superimposed on top of each other (i.e., FIG. 6j is a schematic stack diagram of the film layers shown in FIGS. 6a and 6b). With reference to FIGS. 6a, 6b and 6j, in an embodiment of the present disclosure, the first electrode M1'_1 of the first gating transistor M1 in the $(m-1)^{th}$ row of pixel circuit, the first electrode M2_1 of the second gating transistor M2 in the $m^{th}$ row of pixel circuit, and the second electrode M3_2 of the threshold compensation transistor M3 in the $m^{th}$ row of pixel circuit each have an orthogonal projection on the base located between an orthogonal projection of the $(m-1)^{th}$ row of scan signal line Gate on the base and an orthogonal projection of the $m^{th}$ row of scan signal line Gate on the base. The second electrode M1'_2 of the first gating transistor M1 in the $(m-1)^{th}$ row of pixel circuit, the second electrode M2_2 of the second gating transistor M2 in the $m^{th}$ row of pixel circuit, and the first electrode M3_1 of the threshold compensation transistor M3 in the $m^{th}$ row of pixel circuit each have an orthogonal projection on the base located between the orthogonal projection of the $(m-1)^{th}$ row of scan signal line Gate on the base and an orthogonal projection of the $(m-2)^{th}$ row of scan signal line Gate (not shown) on the base.

Figure 6K:
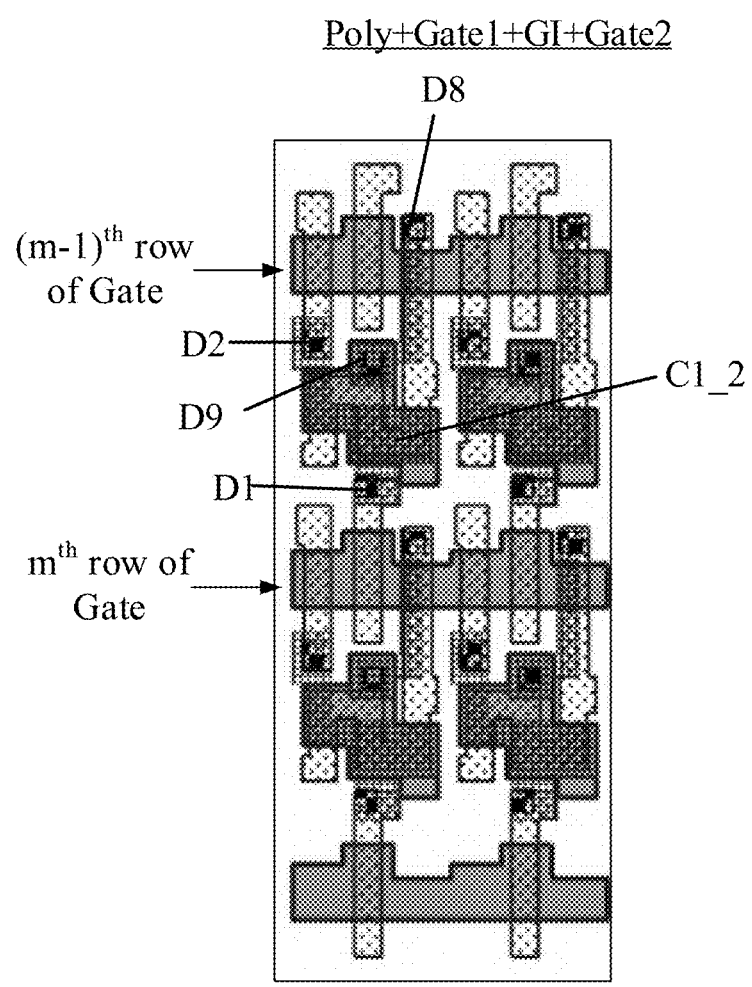

FIG. 6c is a first plan view of a second gate insulation layer according to an embodiment of the present disclosure, FIG. 6d is a first plan view of a second gate metal layer according to an embodiment of the present disclosure, and FIG. 6k is a schematic diagram of the film layers shown in FIGS. 6a to 6d and superimposed on top of each other. Referring to FIGS. 6a to 6d and FIG. 6k, the second gate metal layer Gate2 includes a first connection part G1 having a first end D1 connected to the second electrode M1_2 of the first gating transistor M1 through a first via H1, and a second end D2 connected to the first electrode M2_1 of the second gating transistor M2 through a second via H2. The first via H1 penetrates through the first gate insulation layer and the second gate insulation layer GI, and exposes the second electrode M1_2 of the first gating transistor M1, while the second via H2 penetrates through the first gate insulation layer and the second gate insulation layer GI, and exposes the first electrode M2_1 of the second gating transistor M2. Optionally, the second gate metal layer Gate2 may be made of a metal material such as silver, aluminum, molybdenum, copper, or the like, and the second gate insulation layer GI may be a single-layer or multi-layer structure including a silicon nitride layer, a silicon oxide layer, or a silicon oxynitride layer, which are not specifically limited in the embodiments of the present disclosure.

It should be noted that the first gating transistor M1 and the second gating transistor M2 here are both transistors in the $m^{th}$ row of pixel circuit, and the transistors described below in the embodiments of the present disclosure also refer to transistors in the $m^{th}$ row of pixel circuit.

In some specific embodiments, the second gate metal layer Gate2 further includes a second connection part G2 spaced apart from the first connection part G1. A first end D8 of the second connection part G2 is connected to the first electrode M3_1 of the threshold compensation transistor M3 through an eighth via H8, and a second end D9 of the second connection part G2 is connected to the gate electrode MD_3 of the driving transistor MD through a ninth via H9. The eighth via H8 penetrates through the first gate insulation layer and the second gate insulation layer GI, and exposes the first electrode M3_1 of the threshold compensation transistor M3, while the ninth via H9 penetrates through the second gate insulation layer GI, and exposes the gate electrode MD_3 of the driving transistor MD.

In some specific embodiments, the gate electrode MD_3 of the driving transistor MD forms a one-piece structure with the first plate of the first capacitor C1 and the first connection part G1 forms a one-piece structure with the second plate C1_2 of the first capacitor C1. Specifically, in a direction perpendicular to the paper (i.e., each of the plain views), a portion of the gate electrode MD_3 of the driving transistor MD is covered by the first connection part G1, a portion of the first connection part G1 covering the gate electrode MD_3 of the driving transistor MD is formed into the second plate C1_2 of the first capacitor C1, and the portion of the gate electrode MD_3 of the driving transistor MD covered by the first connection part G1 is formed into the first plate of the first capacitor C1.

Figure 6L:
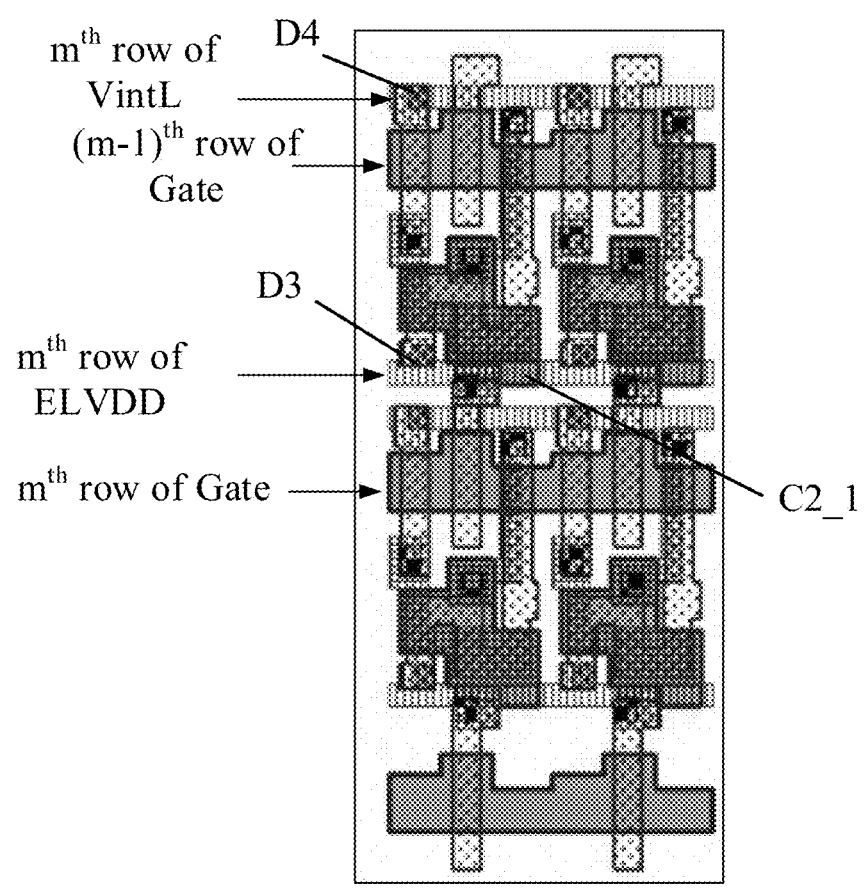

FIG. 6e is a first plan view of a first interlayer dielectric layer according to an embodiment of the present disclosure, FIG. 6f is a first plan view of a first source-drain metal layer according to an embodiment of the present disclosure, and FIG. 6l is a schematic diagram of the film layers shown in FIGS. 6a to 6f and superimposed on top of each other. Referring to FIGS. 6a to 6f and FIG. 6l, in some specific embodiments, a first interlayer dielectric layer ILD1 is disposed on a side of the second gate metal layer Gate2 distal to the base, and a first source-drain metal layer SD1 is disposed on a side of the first interlayer dielectric layer ILD1 distal to the base. The first power supply line ELVDD is located in the first source-drain metal layer SD1. A first end D3 of the first power line ELVDD is connected to the first electrode MD_1 of the driving transistor MD through a third via H3. The third via H3 penetrates through the first gate insulation layer, the second gate insulation layer GI and the first interlayer dielectric layer ILD1, and exposes the first electrode MD_1 of the driving transistor MD. Optionally, the first source-drain metal layer SD1 may be made of a metal material such as silver, aluminum, molybdenum, copper, or the like, the first interlayer dielectric layer ILD1 may be a single-layer or multi-layer structure including a silicon nitride layer, a silicon oxide layer, or a silicon oxynitride layer, which are not specifically limited in the embodiments of the present disclosure.

In some specific embodiments, the reference signal line VintL is located in the first source-drain metal layer SD1, and a first end D4 of the reference signal line VintL is connected to the first electrode M2_1 of the second gating transistor M2 through a fourth via H4. The fourth via H4 penetrates through the first gate insulation layer, the second gate insulation layer GI and the first interlayer dielectric layer ILD1, and exposes the first electrode M2_1 of the second gating transistor M2.

In an embodiment of the present disclosure, the display substrate includes M rows of reference signal lines VintL and M rows of first power supply lines ELVDD, and the $m^{th}$ row of pixel circuit is connected to both the $m^{th}$ row of reference signal line VintL and the $m^{th}$ row of first power supply line ELVDD. The reference signal line VintL and the first power line ELVDD each extend in the first direction. An orthogonal projection of the $m^{th}$ row of the reference signal line VintL on the base and an orthogonal projection of the $m^{th}$ row of the first power line ELVDD on the base are respectively located on two opposite sides of the orthogonal projection of the $(m-1)^{th}$ row of the scan signal line Gate on the base.

In some specific embodiments, the gate electrode MD_3 of the driving transistor MD forms a one-piece structure with the second plate of the second capacitor C2, and a first plate C2_1 of the second capacitor C2 forms a one-piece structure with the first power line ELVDD. Specifically, a portion of the gate electrode MD_3 of the driving transistor MD is disposed opposite to the first power line ELVDD, and the opposite portions of the gate electrode MD_3 of the driving transistor MD and the first power line ELVDD form two plates of the second capacitor C2.

Figure 6M:
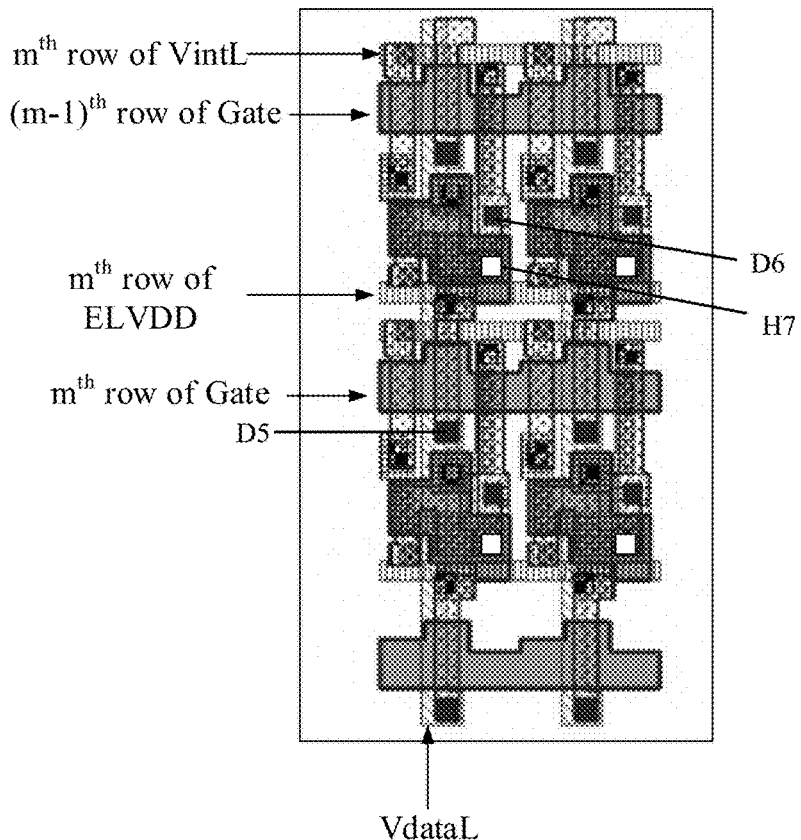

FIG. 6g is a first plan view of a second interlayer dielectric layer according to an embodiment of the present disclosure, FIG. 6h is a first plan view of a second source-drain metal layer according to an embodiment of the present disclosure, FIG. 6i is a first plan view of a planarization layer according to an embodiment of the present disclosure, and FIG. 6m is a schematic diagram of the film layers shown in FIGS. 6a to 6i and superimposed on top of each other. Referring to FIGS. 6a to 6i and FIG. 6m, in some specific embodiments, a second interlayer dielectric layer ILD2 is disposed on a side of the first source-drain metal layer SD1 distal to the base, a second source-drain metal layer SD2 is disposed on a side of the second interlayer dielectric layer ILD2 distal to the base, and the data signal line VdataL is located in the second source-drain metal layer SD2. A first end D5 of the data signal line VdataL is connected to the first electrode of the first gating transistor M1 through a fifth via H5. The fifth via H5 penetrates through the first gate insulation layer, the second gate insulation layer GI, the first interlayer dielectric layer ILD1 and the second interlayer dielectric layer ILD2, and exposes the first electrode of the first gating transistor M1. In an embodiment of the present disclosure, the data signal line VdataL extends in the second direction.

In some specific embodiments, the second source-drain metal layer SD2 is further provided with a connection member S spaced apart from the data signal line VdataL, a first end D7 of the connection member S is connected to the first electrode of the light-emitting device L, and a second end D6 of the connection member S is connected to the second electrode MD_2 of the driving transistor MD through a sixth via H6. The sixth via H6 penetrates through the first gate insulation layer, the second gate insulation layer GI, the first interlayer dielectric layer ILD1 and the second interlayer dielectric layer ILD2, and exposes the second electrode MD_2 of the driving transistor MD.

In some specific embodiments, the light-emitting device includes: a first electrode, a light-emitting layer, and a second electrode arranged in a direction away from the base. A pixel defining layer (not shown) is disposed on a side of the planarization layer PLN distal to the base, a pixel opening is disposed in the pixel defining layer and exposes at least a portion of the first electrode of the light-emitting device, the light-emitting layer is disposed in the pixel opening, and the first electrode of the light-emitting device L is connected to the first end D7 of the connection member S through a seventh via H7 penetrating through the planarization layer PLN.

Figure 7A:
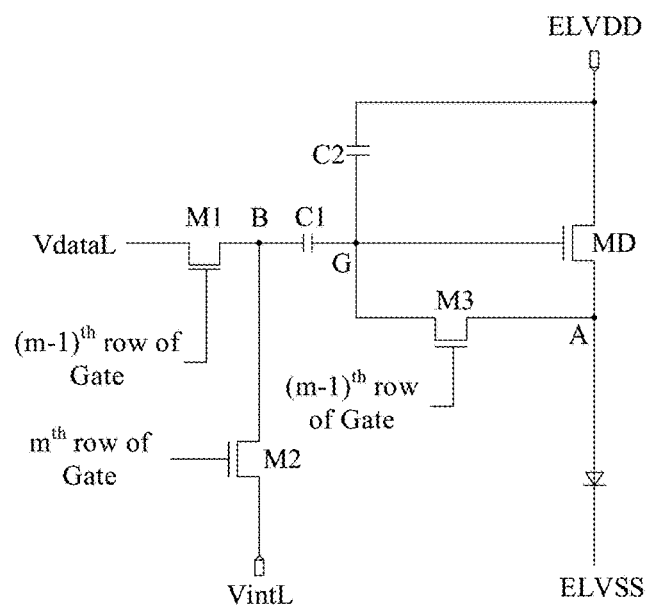
FIG. 7a is a second schematic diagram showing a specific structure of a pixel circuit according to an embodiment of the present disclosure.
Figure 7B:
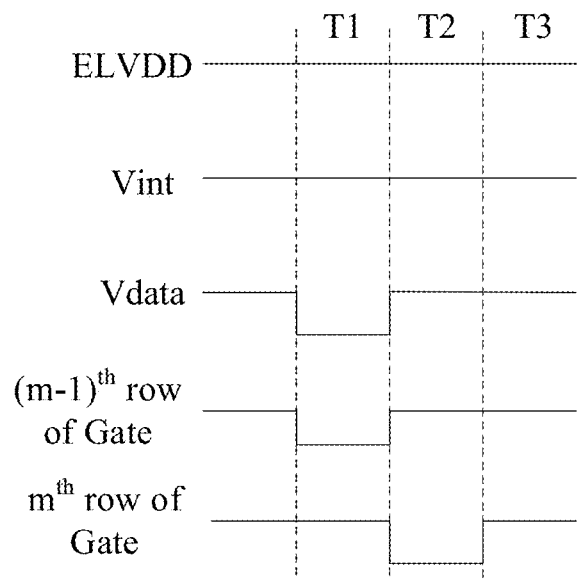
FIG. 7b is a second driving timing diagram of a pixel circuit according to an embodiment of the present disclosure.

FIG. 7a is a second schematic diagram showing a specific structure of a pixel circuit according to an embodiment of the present disclosure, and FIG. 7b is a second driving timing diagram of a pixel circuit according to an embodiment of the present disclosure. Referring to FIGS. 7a and 7b, the case where the gate electrode of the first gating transistor M1 in the $m^{th}$ row of pixel circuit is connected to the $(m-1)^{th}$ row of scan signal line Gate, and the gate electrode of the second gating transistor M2 in the $m^{th}$ row of pixel circuit is connected to the $m^{th}$ row of scan signal line Gate according to an embodiment of the present disclosure is explained in details below.

In the first input phase T1 of the $m^{th}$ row of pixel circuit, a turn-on level signal is provided to the $(m-1)^{th}$ row of scan signal line Gate, and a turn-off level signal is provided to the $m^{th}$ row of scan signal line Gate. At this time, the first gating transistor M1 and the threshold compensation transistor M3 are turned on, node B has a voltage Vdata, the driving transistor MD makes electricity leaked to node G through the threshold compensation transistor M3, and the driving transistor MD is turned off until the voltage at node G reaches ELVDD'+Vth.

In the second input phase T2 of the $m^{th}$ row of pixel circuit, a turn-off level signal is provided to the $(m-1)^{th}$ row of scan signal line Gate, and a turn-on level signal is provided to the $m^{th}$ row of scan signal line Gate. At this time, the first gating transistor M1 and the threshold compensation transistor M3 are turned off, the second gating transistor M2 is turned on, the voltage at node B jumps from Vdata to Vint, and the voltage at node G jumps to ELVDD'+Vth+(Vint−Vdata)*(C1'/(C1'+C2')).

In the light-emitting phase T3 of the $m^{th}$ row pixel circuit, a turn-off level signal is provided to the $(m-1)^{th}$ row of scan signal line Gate and the $m^{th}$ row of scan signal line Gate, respectively. At this time, the second gating transistor M2 is turned off, the voltage at node G remains at ELVDD'+Vth+(Vint−Vdata)*(C1'/(C1'+C2')), where Vint<Vdata, and Vgs−Vth=(Vint−Vdata)*(C1'/(C1'+C2'))<0, so that the driving transistor MD is turned on, and supplies the light-emitting current I to the light-emitting device L.

FIGS. 8*a* to 8*m* are second plan views of various film layers in a pixel circuit according to an embodiment of the present disclosure. A planar structure of the pixel circuit in the embodiment of the present disclosure will be described below with reference to FIGS. 8*a* to 8*m*. In an embodiment of the present disclosure, the pixel circuit includes a base, and a semiconductor layer Poly, a first gate insulation layer (not shown), a first gate metal layer Gate1, a second gate insulation layer GI, and a second gate metal layer Gate2 sequentially arranged in a direction away from the base.

Figure 8A:
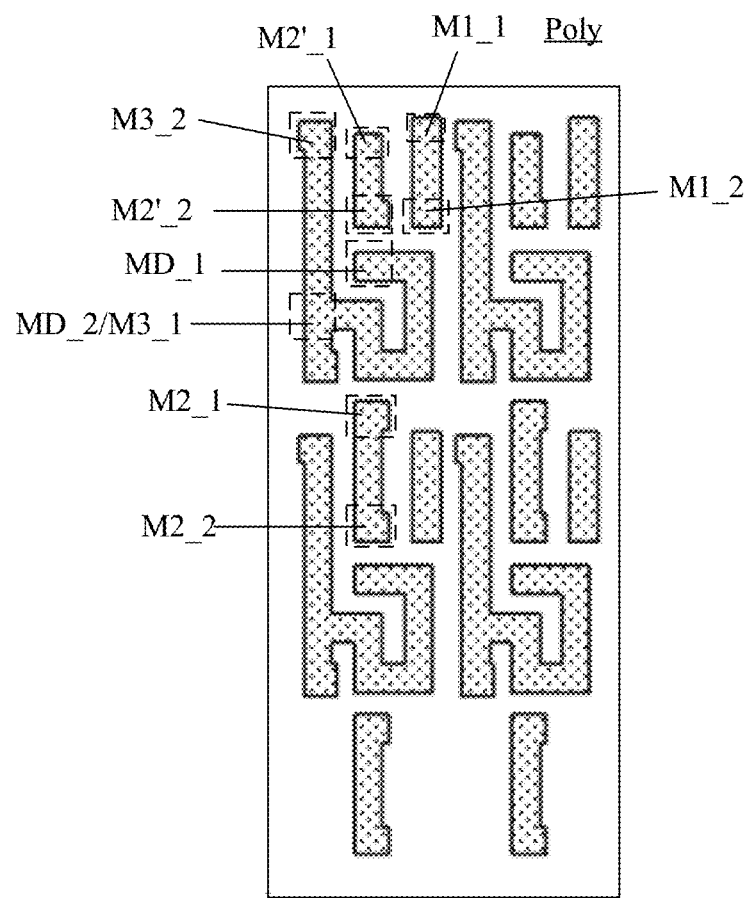
FIGS. 8a to 8m are second plan views of various film layers in a pixel circuit according to an embodiment of the present disclosure.

FIG. 8*a* is a second schematic diagram of a semiconductor layer according to an embodiment of the present disclosure. As shown in FIG. 8*a*, the first electrode MD_1 and the second electrode MD_2 of the driving transistor MD, the first electrode M1_1 and the second electrode M1_2 of the first gating transistor M1, the first electrodes M2_1 (M2'_1) and the second electrodes M2_2 (M2'_2) of the second gating transistors M2, the first electrode M3_1 and the second electrode M3_2 of the threshold compensation transistor M3 are disposed in a same layer and each located in the semiconductor layer Poly. The second electrode MD_2 of the driving transistor MD and the first electrode M3_1 of the threshold compensation transistor M3 may be connected to each other to form a one-piece structure.

Figure 8B:
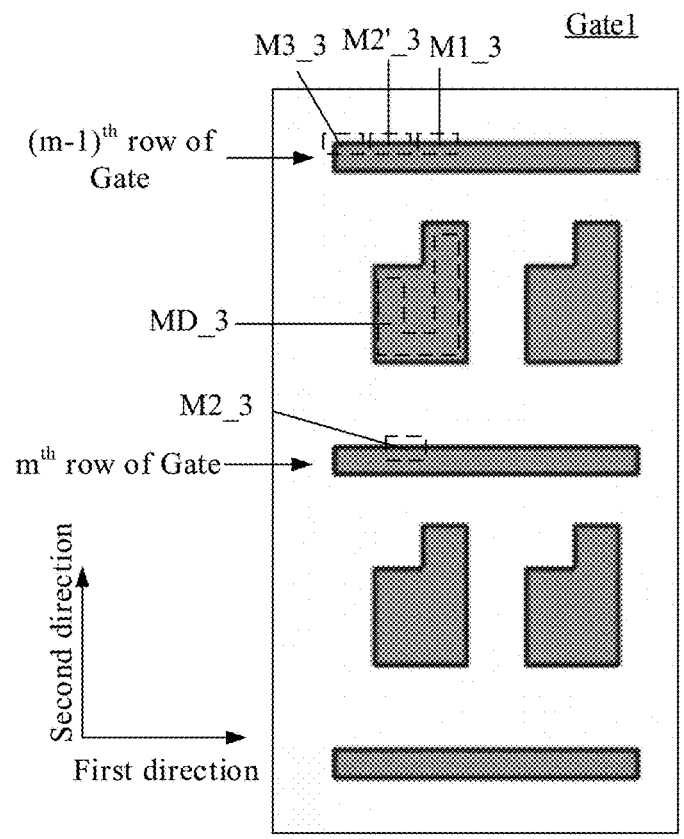

FIG. 8*b* is a second schematic structural diagram of a first gate metal layer according to an embodiment of the present disclosure. As shown in FIG. 8*b*, the gate electrode MD_3 of the driving transistor MD, the gate electrode M1_3 of the first gating transistor M1, the gate electrodes M2_3 (M2'_3) of the second gating transistors M2, the gate electrode M3_3 of the threshold compensation transistor M3, and the scan signal lines Gate are disposed in a same layer and each located in the first gate metal layer Gate1.

Unlike the embodiment shown in FIGS. 6*a* to 6*m*, in the present embodiment, the gate electrode M2'_3 of the second gating transistor M2 in the $(m-1)^{th}$ row of pixel circuit, the gate electrode M1_3 of the first gating transistor M1 in the $m^{th}$ row of pixel circuit, and the gate electrode M3_3 of the threshold compensation transistor M3 in the $m^{th}$ row of pixel circuit form a one-piece structure.

In some specific embodiments, the scan signal lines Gate extend in the first direction shown in the figure, and the gate electrode M3_3 of the threshold compensation transistor M3 in the $m^{th}$ row of pixel circuit, the gate electrode M2'_3 of the second gating transistor M2 in the $(m-1)^{th}$ row of pixel circuit, and the gate electrode M1_3 of the first gating transistor M1 in the $m^{th}$ row of pixel circuit is arranged along an extending direction of the $(m-1)^{th}$ row of scan signal line Gate.

Figure 8C:
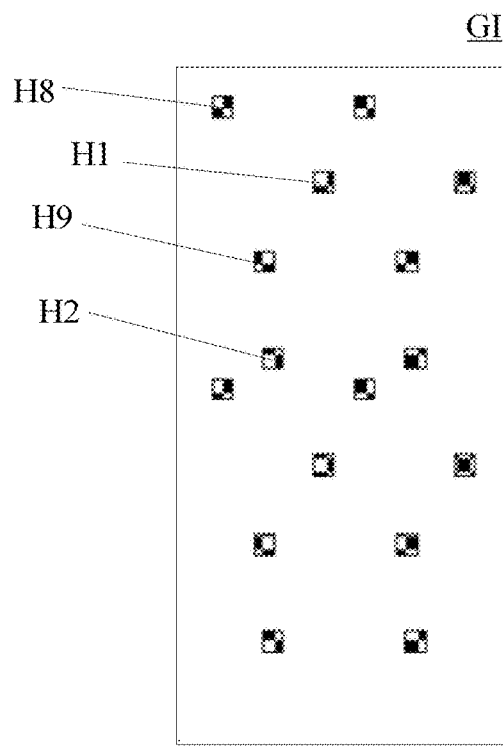
Figure 8D:
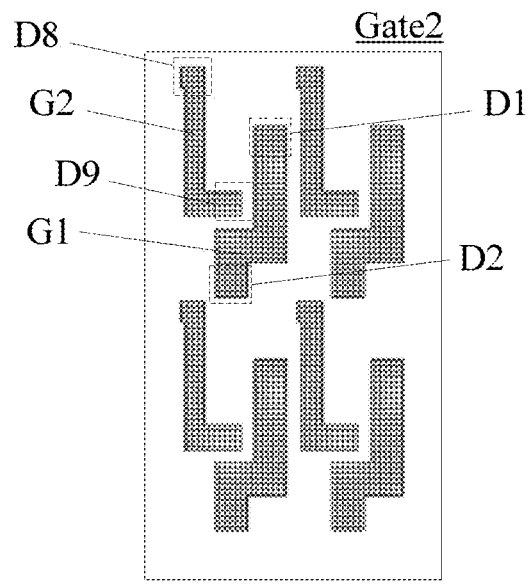
Figure 8E:
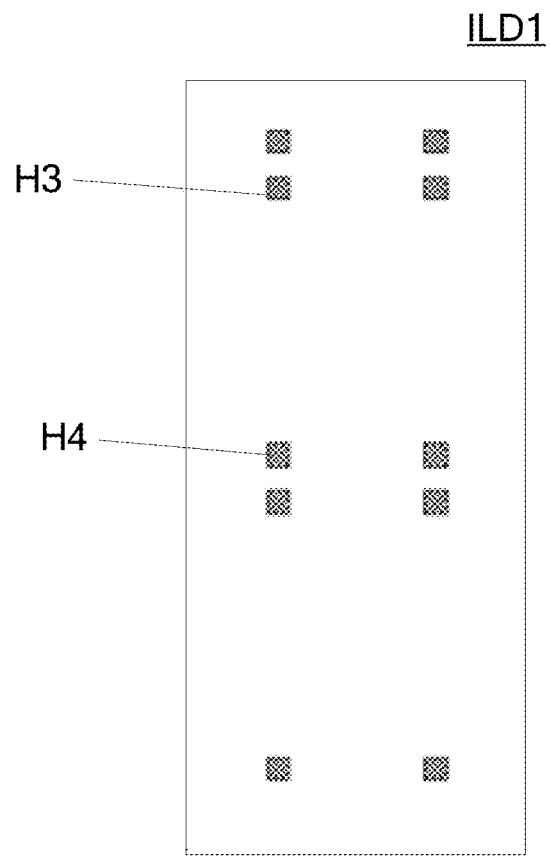
Figure 8F:
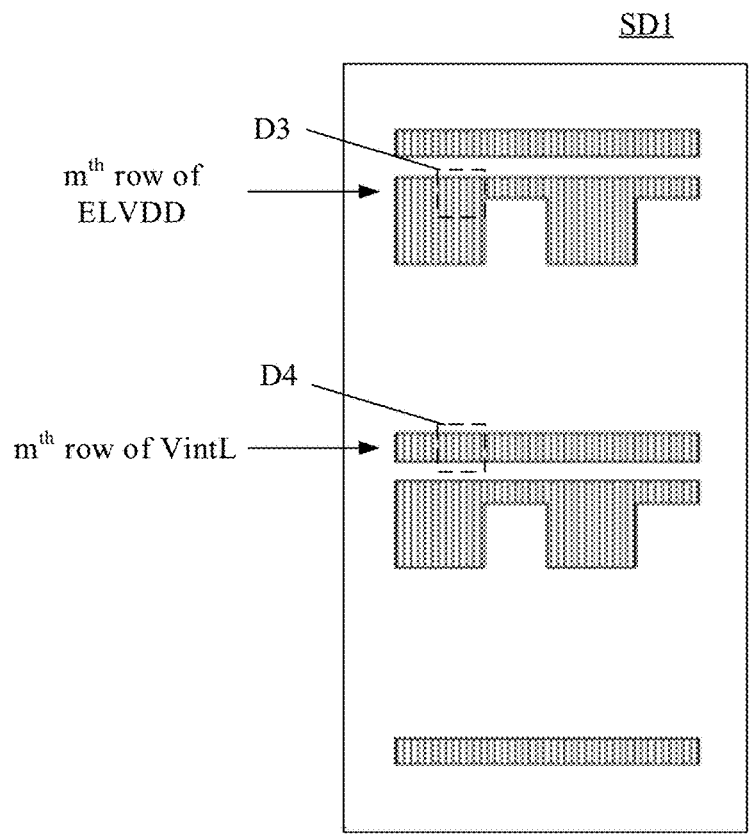
Figure 8G:
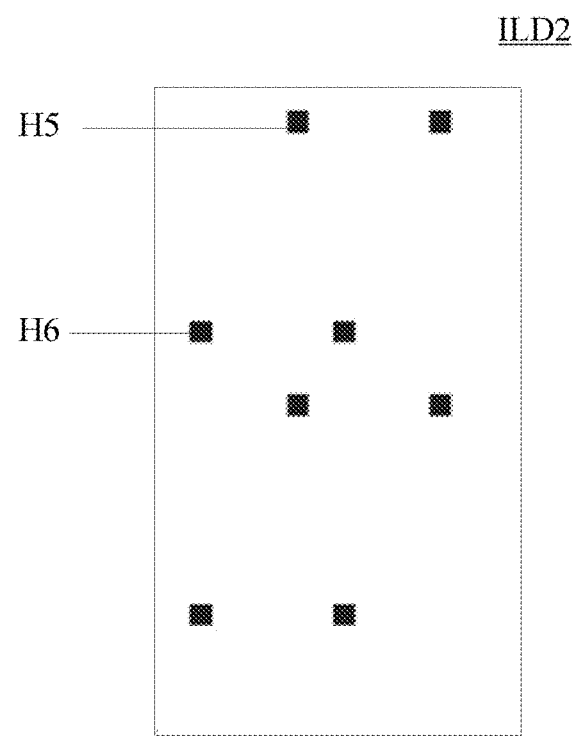
Figure 8H:
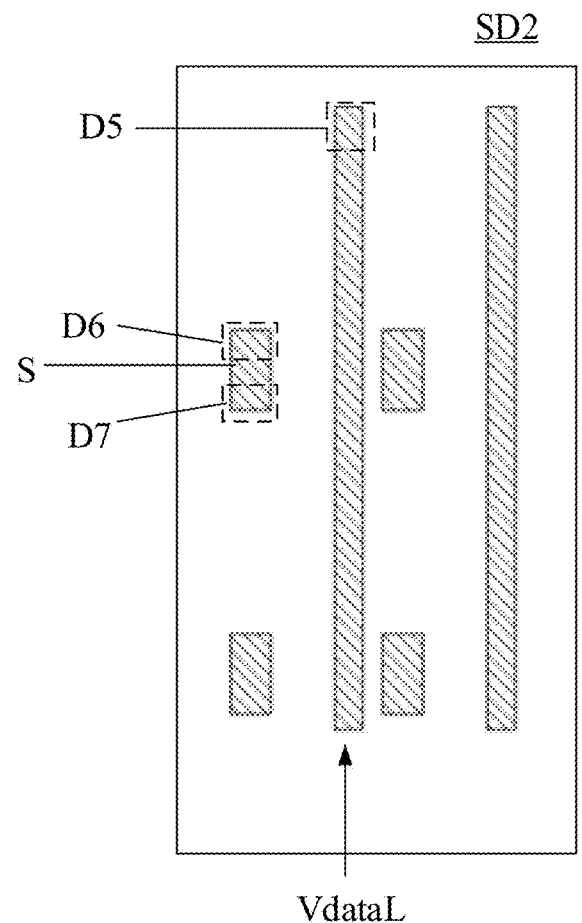
Figure 8I:
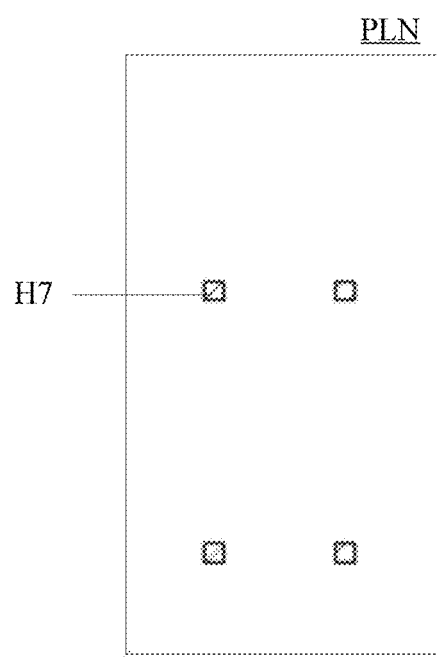
Figure 8J:
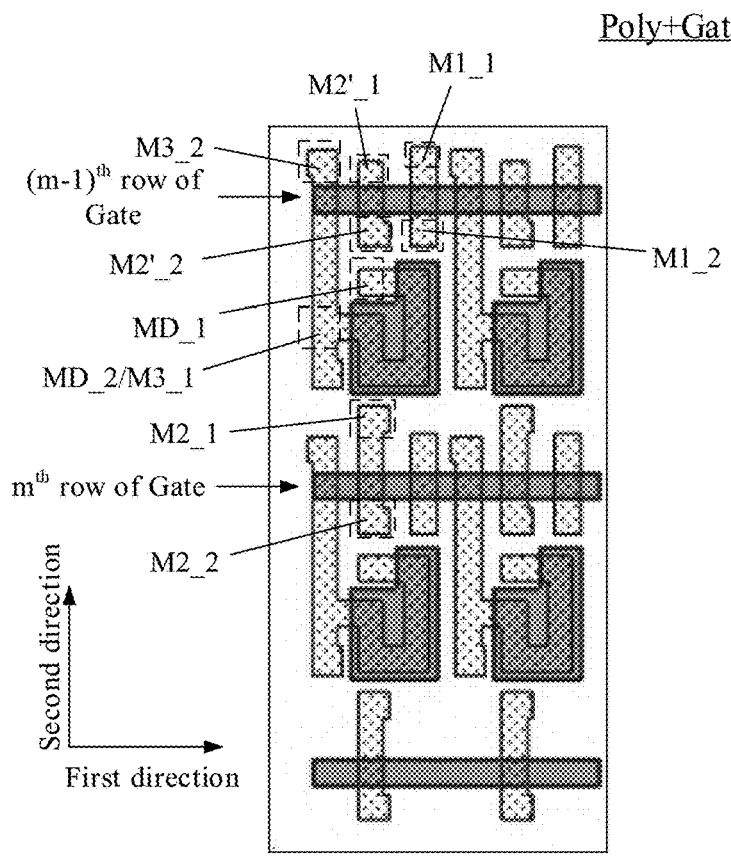

FIG. 8*j* is a schematic diagram of the film layers shown in FIGS. 8*a* and 8*b* and superimposed on top of each other. Referring to FIGS. 8*a*, 8*b* and 8*j*, the second electrode M2'_2 of the second gating transistor M2 in the $(m-1)^{th}$ row of pixel circuit, the second electrode M1_2 of the first gating transistor M1 in the $m^{th}$ row of pixel circuit, and the first electrode M3_1 of the threshold compensation transistor M3 in the $m^{th}$ row of pixel circuit each have an orthogonal projection on the base located between an orthogonal projection of the $(m-1)^{th}$ row of scan signal line Gate on the base and an orthogonal projection of the $m^{th}$ row of scan signal line Gate on the base. The first electrode M2'_1 of the second gating transistor M2 in the $(m-1)^{th}$ row of pixel circuit, and the first electrode M1_1 of the first gating transistor M1 in the $m^{th}$ row of pixel circuit, and the second electrode M3_2 of the threshold compensation transistor M3 in the $m^{th}$ row of pixel circuit each have an orthogonal projection on the base located between the orthogonal projection of the $(m-1)^{th}$ row of scan signal line Gate on the base and an orthogonal projection of the $(m-2)^{th}$ row of scan signal line Gate (not shown) on the base.

Figure 8K:
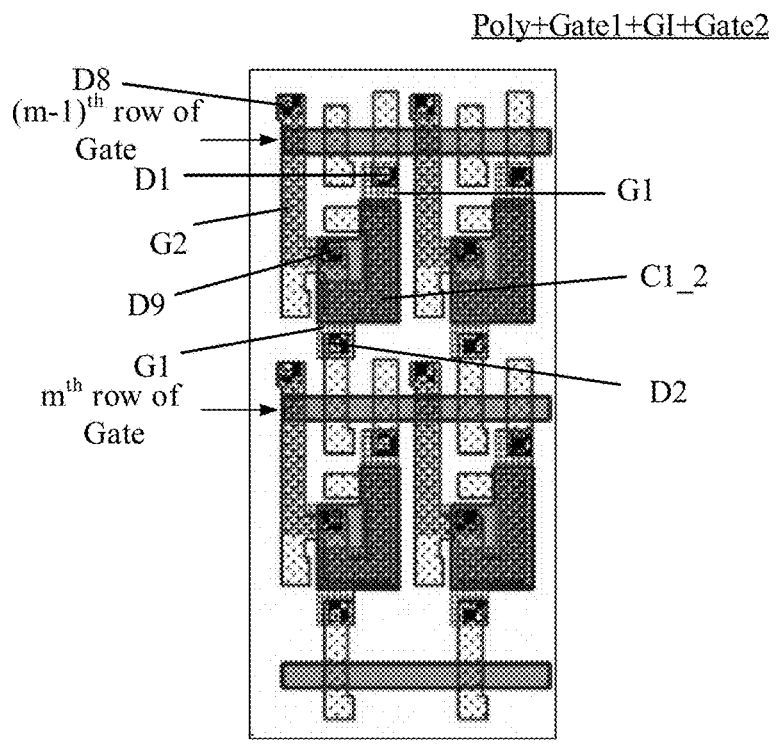

FIG. 8*c* is a second plan view of a second gate insulation layer according to an embodiment of the present disclosure, FIG. 8*d* is a second plan view of a second gate metal layer according to an embodiment of the present disclosure, and FIG. 8*k* is a schematic diagram of the film layers shown in FIGS. 8*a* to 8*d* and superimposed on top of each other. Referring to FIGS. 8*a* to 8*d* and FIG. 8*k*, the second gate metal layer Gate2 includes a first connection part G1 having a first end D1 connected to the second electrode M1_2 of the first gating transistor M1 through a first via H1, and a second end D2 connected to the second electrode M2_2 of the second gating transistor M2 through a second via H2. The first via H1 penetrates through the first gate insulation layer and the second gate insulation layer GI, and exposes the second electrode M1_2 of the first gating transistor M1, while the second via H2 penetrates through the first gate insulation layer and the second gate insulation layer GI, and exposes the second electrode M2_2 of the second gating transistor M2.

It should be noted that the first gating transistor M1 and the second gating transistor M2 here are both transistors in the $m^{th}$ row of pixel circuit, and the transistors described below in the embodiments of the present disclosure also refer to transistors in the $m^{th}$ row of pixel circuit.

In some specific embodiments, the second gate metal layer Gate2 further includes a second connection part G2 spaced apart from the first connection part G1. A first end D8 of the second connection part G2 is connected to the second electrode M3_2 of the threshold compensation transistor M3 through an eighth via H8, and a second end D9 of the second connection part G2 is connected to the gate electrode MD_3 of the driving transistor MD through a ninth via H9. The eighth via H8 penetrates through the first gate insulation layer and the second gate insulation layer GI, and exposes the second electrode M3_2 of the threshold compensation transistor M3, while the ninth via H9 penetrates through the second gate insulation layer GI, and exposes the gate electrode MD_3 of the driving transistor MD.

In some specific embodiments, the gate electrode MD_3 of the driving transistor MD forms a one-piece structure with the first plate of the first capacitor C1, and the first connection part G1 forms a one-piece structure with the second plate C1_2 of the first capacitor C1. Specifically, in a direction perpendicular to the paper (i.e., perpendicular to each of the plain views), a portion of the gate electrode MD_3 of the driving transistor MD is covered by the first connection part G1, a portion of the first connection part G1 covering the gate electrode MD_3 of the driving transistor MD is formed into the second plate C1_2 of the first capacitor C1, and the portion of the gate electrode MD_3 of the driving transistor MD covered by the first connection part G1 is formed into the first plate of the first capacitor C1.

Figure 8L:
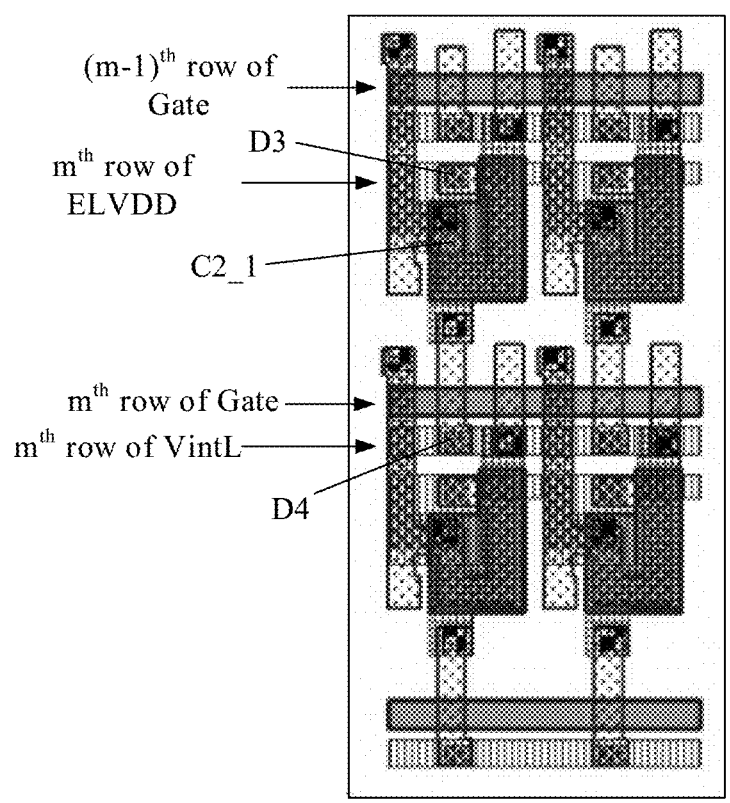

FIG. 8e is a second plan view of a first interlayer dielectric layer according to an embodiment of the present disclosure, FIG. 8f is a second plan view of a first source-drain metal layer according to an embodiment of the present disclosure, and FIG. 8l is a schematic diagram of the film layers shown in FIGS. 8a to 8f and superimposed on top of each other. Referring to FIGS. 8a to 8f and FIG. 8l, in some specific embodiments, a first interlayer dielectric layer ILD1 is disposed on a side of the second gate metal layer Gate2 distal to the base, and a first source-drain metal layer SD1 is disposed on a side of the first interlayer dielectric layer ILD1 distal to the base. The first power supply line ELVDD is located in the first source-drain metal layer SD1. A first end D3 of the first power line ELVDD is connected to the first electrode MD_1 of the driving transistor MD through a third via H3. The third via H3 penetrates through the first gate insulation layer, the second gate insulation layer GI and the first interlayer dielectric layer ILD1, and exposes the first electrode MD_1 of the driving transistor MD.

In some specific embodiments, the reference signal line VintL is located in the first source-drain metal layer SD1, and spaced apart from the first power line ELVDD. A first end D4 of the reference signal line VintL is connected to the second electrode M2_2 of the second gating transistor M2 through a fourth via H4. The fourth via H4 penetrates through the first gate insulation layer, the second gate insulation layer GI and the first interlayer dielectric layer ILD1, and exposes the first electrode M2_1 of the second gating transistor M2. In an embodiment of the present disclosure, the reference signal line VintL and the first power line ELVDD each extend in the first direction, the display substrate includes M rows of reference signal lines VintL and M rows of first power supply lines ELVDD, and the $m^{th}$ row of pixel circuit is connected to the $m^{th}$ row of reference signal line VintL and the $m^{th}$ row of first power supply line ELVDD. An orthogonal projection of the $m^{th}$ row of the reference signal line VintL on the base, and an orthogonal projection of the $m^{th}$ row of the first power line ELVDD on the base are respectively located on two opposite sides of the orthogonal projection of the $m^{th}$ row of scan signal line Gate on the base.

In some specific embodiments, the gate electrode MD_3 of the driving transistor MD forms a one-piece structure with the second plate of the second capacitor C2, and a first plate C2_1 of the second capacitor C2 forms a one-piece structure with the first power line ELVDD. Specifically, a portion of the gate electrode MD_3 of the driving transistor MD is disposed opposite to the first power line ELVDD, and the opposite portions of the gate electrode MD_3 of the driving transistor MD and the first power line ELVDD form two plates of the second capacitor C2.

Figure 8M:
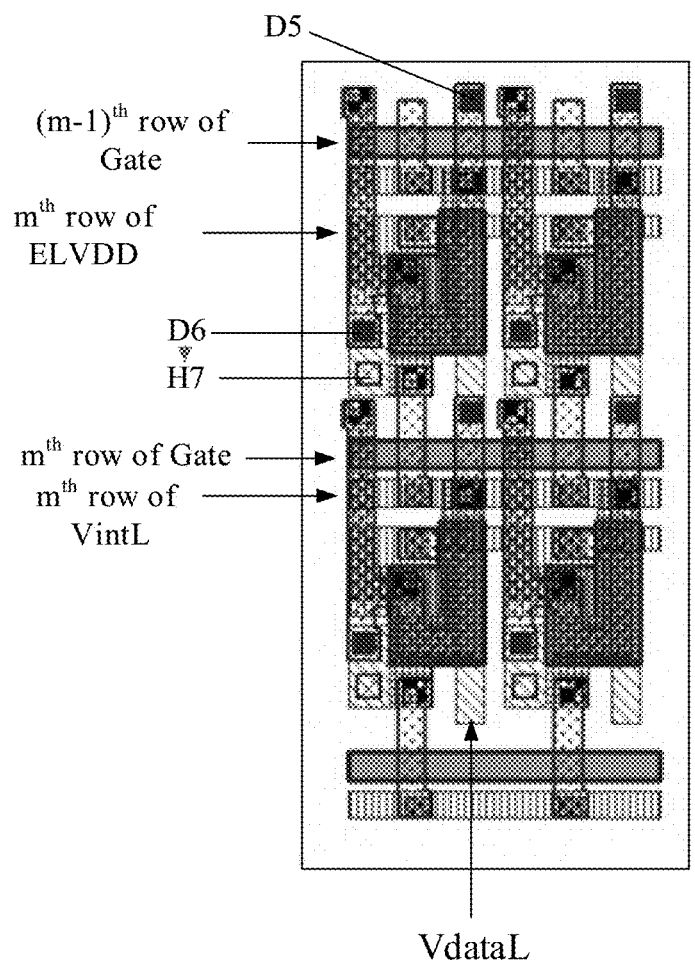

FIG. 8g is a second plan view of a second interlayer dielectric layer according to an embodiment of the present disclosure, FIG. 8h is a second plan view of a second source-drain metal layer according to an embodiment of the present disclosure, FIG. 8i is a second plan view of a planarization layer according to an embodiment of the present disclosure, and FIG. 8m is a schematic diagram of the film layers shown in FIGS. 8a to 8i and superimposed on top of each other. Referring to FIGS. 8a to 8i and FIG. 8m, in some specific embodiments, a second interlayer dielectric layer ILD2 is disposed on a side of the first source-drain metal layer SD1 distal to the base, and a second source-drain metal layer SD2 is disposed on a side of the second interlayer dielectric layer ILD2 distal to the base. The data signal line VdataL is located in the second source-drain metal layer SD2. A first end D5 of the data signal line VdataL is connected to the first electrode M1_1 of the first gating transistor M1 through a fifth via H5. The fifth via H5 penetrates through the first gate insulation layer, the second gate insulation layer GI, the first interlayer dielectric layer ILD1 and the second interlayer dielectric layer ILD2, and exposes the first electrode M1_1 of the first gating transistor M1. In an embodiment of the present disclosure, the data signal line VdataL extends in the second direction.

In some specific embodiments, the second source-drain metal layer SD2 is further provided with a connection member S spaced apart from the data signal line VdataL, a first end D7 of the connection member S is connected to the first electrode of the light-emitting device L, and a second end D6 of the connection member S is connected to the second electrode MD_2 of the driving transistor MD through a sixth via H6. The sixth via H6 penetrates through the first gate insulation layer, the second gate insulation layer GI, the first interlayer dielectric layer ILD1 and the second interlayer dielectric layer ILD2, and exposes the second electrode MD_2 of the driving transistor MD.

In some specific embodiments, the light-emitting device includes: a first electrode, a light-emitting layer, and a second electrode arranged in a direction away from the base. A pixel defining layer (not shown) is disposed on a side of the planarization layer PLN distal to the base, a pixel opening is disposed in the pixel defining layer and exposes at least a portion of the first electrode of the light-emitting device, the light-emitting layer is disposed in the pixel opening, and the first electrode of the light-emitting device L is connected to the first end D7 of the connection member S through a seventh via H7 penetrating through the planarization layer PLN.

It should be noted that in the embodiment shown in FIGS. 8a to 8m, the material of each film layer may be the same as that of a corresponding film layer in the embodiment shown in FIGS. 6a to 6m, and thus is not repeated here.

In some specific embodiments, the pixel circuit may further include a light-emitting control sub-circuit (not shown) connected between the second electrode of the driving transistor MD and the first electrode of the light-emitting device L, and the light-emitting control sub-circuit is configured to electrically connect the second electrode of the driving transistor MD to the light-emitting device L in response to control of a light-emitting control signal.

The light-emitting control sub-circuit includes a light-emitting control transistor having a gate electrode connected to a light-emitting control signal line providing the light-emitting control signal, a first electrode connected to the second electrode of the driving transistor MD, and a second electrode connected to the first electrode of the light-emitting device L.

In this case, a turn-off level signal may be provided to the light-emitting control signal line EML during the first input phase T1 and the second input phase T2 described above, to cause the light-emitting control sub-circuit to electrically disconnect the second electrode of the driving transistor MD from the first electrode of the light-emitting device L; and in the light-emitting phase T3, a turn-on level signal is provided to the light-emitting control signal line EML, to cause the light-emitting control sub-circuit to electrically connect the second electrode of the driving transistor MD to the first electrode of the light-emitting device L, and thus enable a driving current generated by the driving transistor MD to flow through the light-emitting device L to make the light-emitting device L emit light.

An embodiment of the present disclosure further provides a driving method for the display substrate as described above. The driving method includes steps that in the first input phase T1 of the $m^{th}$ row of pixel circuit, a turn-on level signal is provided to the $(m-1)^{th}$ row of scan signal line Gate, and a turn-off level signal is provided to the $m^{th}$ row of scan signal line Gate, so that the gating sub-circuit 3 provides a first signal to the second terminal of the second storage sub-circuit 2, and the threshold compensation sub-circuit 4 performs threshold compensation on the driving transistor MD.

The driving method further includes steps that, in the second input phase T2 of the $m^{th}$ row of pixel circuit, a turn-off level signal is provided to the $(m-1)^{th}$ row of scan signal line Gate, and a turn-on level signal is provided to the $m^{th}$ row of scan signal line Gate, so that the gating sub-circuit 3 provides a second signal to the second terminal of the second storage sub-circuit 2.

The driving method further includes steps that, in the light-emitting phase T3 of the $m^{th}$ row pixel circuit, a turn-off level signal is provided to the $(m-1)^{th}$ row of scan signal line Gate and the $m^{th}$ row of scan signal line Gate, respectively, so that the driving transistor MD provides a light-emitting current to the light-emitting device L according to a voltage difference between the gate electrode and the first electrode of the driving transistor MD.

One of the first signal and the second signal is the data voltage signal Vdata, and the other is the reference voltage signal Vint.

The detailed operating process has been described above, and thus will not be repeated here.

An embodiment of the present disclosure further provides a display apparatus including the display substrate as described above. The display apparatus may be an OLED panel, a mobile phone, a tablet computer, a television, a monitor, a laptop computer, a digital album, a navigator, or any other product or component having a display function.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made therein without departing from the spirit or essence of the present disclosure. Such modifications and variations should also be considered as falling into the protection scope of the present disclosure.

What is claimed is:

1. A display substrate, comprising: M rows of pixel circuits and M rows of scan signal lines, wherein each pixel circuit comprises:

a driving transistor having a first electrode connected to a first power line, and a second electrode connected to a first electrode of a light-emitting device;

a first storage sub-circuit having a first terminal connected to a gate electrode of the driving transistor;

a second storage sub-circuit having a first terminal connected to the first power line, and a second terminal connected to the gate electrode of the driving transistor;

a gating sub-circuit connected to a second terminal of the first storage sub-circuit, wherein the gating sub-circuit of an $m^{th}$ row of pixel circuit is further connected to an $(m-1)^{th}$ row of scan signal line and an $m^{th}$ row of scan signal line, and the gating sub-circuit is configured to: provide, in response to control of one row of scan signal line of the $(m-1)^{th}$ row of scan signal line and the $m^{th}$ row of scan signal line, a data voltage signal to the second terminal of the first storage sub-circuit, and provide, in response to control of the other row of scan signal line of the $(m-1)^{th}$ row of scan signal line and the $m^{th}$ row of scan signal line, a reference voltage signal to the second terminal of the first storage sub-circuit; and a threshold compensation sub-circuit connected to the gate electrode and the second electrode of the driving transistor, wherein the threshold compensation sub-circuit of the $m^{th}$ row of pixel circuit is further connected to the $(m-1)^{th}$ row of scan signal line, and the threshold compensation sub-circuit is configured to perform, in response to control of the scan signal line connected thereto, threshold compensation on the driving transistor;

where $1<m\leq M$, and both m and M are positive integers;

wherein the gating sub-circuit comprises a first gating transistor and a second gating transistor;

a first electrode of the first gating transistor is connected to a data signal line providing the data voltage signal, a second electrode of the second gating transistor is connected to a reference signal line providing the reference voltage signal, and a second electrode of the first gating transistor and a first electrode of the second gating transistor are both connected to the second terminal of the first storage sub-circuit; and wherein the gate electrode of the first gating transistor in the $(m-1)^{th}$ row of pixel circuit and the gate electrode of the second gating transistor in the $m^{th}$ row of pixel circuit form a one-piece structure.

2. The display substrate according to claim 1, wherein the first electrode and the second electrode of the driving transistor, the first electrode and the second electrode of the first gating transistor, and the first electrode and the second electrode of the second gating transistor are disposed in a same layer;

on a side of the first electrode and the second electrode of the driving transistor distal to a base of the display substrate, a first gate insulation layer, a first gate metal layer, a second gate insulation layer, and a second gate metal layer are sequentially arranged, and the gate electrode of the driving transistor, the gate electrode of the first gating transistor, and the gate electrode of the second gating transistor are each located in the first gate metal layer; and the second gate metal layer comprises a first connection part having one end connected to the second electrode of the first gating transistor through a first via, and the other end connected to the first electrode of the second gating transistor through a second via, the first via and the second via each penetrating through the first gate insulation layer and the second gate insulation layer.

3. The display substrate according to claim 2, further comprising a first interlayer dielectric layer disposed on a side of the second gate metal layer distal to the base, and a first source-drain metal layer disposed on a side of the first interlayer dielectric layer distal to the base, wherein the first power line is located in the first source-drain metal layer; and the first power line is connected to the first electrode of the driving transistor through a third via which penetrates through the first gate insulation layer, the second gate insulation layer and the first interlayer dielectric layer.

4. The display substrate according to claim 3, wherein the reference signal line is located in the first source-drain metal layer, and connected to the second electrode of the second gating transistor through a fourth via which penetrates through the first gate insulation layer, the second gate insulation layer and the first interlayer dielectric layer.

5. The display substrate according to claim 3, further comprising a second interlayer dielectric layer disposed on a side of the first source-drain metal layer distal to the base, and a second source-drain metal layer disposed on a side of the second interlayer dielectric layer distal to the base, wherein the data signal line is located in the second source-drain metal layer; and the data signal line is connected to the first electrode of the first gating transistor through a fifth via which penetrates through the first gate insulation layer, the second gate insulation layer, the first interlayer dielectric layer, and the second interlayer dielectric layer.

6. The display substrate according to claim 5, wherein the second source-drain metal layer is further provided with a connection member having one end connected to the first electrode of the light-emitting device, and the other end connected to the second electrode of the driving transistor through a sixth via which penetrates through the first gate insulation layer, the second gate insulation layer, the first interlayer dielectric layer, and the second interlayer dielectric layer.

7. The display substrate according to claim 6, further comprising a planarization layer disposed between the connection member and the first electrode of the light-emitting device, wherein the first electrode of the light-emitting device is connected to the connection member through a seventh via penetrating through the planarization layer.

8. The display substrate according to claim 2, wherein the first storage sub-circuit comprises a first capacitor, and the second storage sub-circuit comprises a second capacitor; and the gate electrode of the driving transistor forms a one-piece structure with both a second plate of the second capacitor and a first plate of the first capacitor, a first plate of the second capacitor forms a one-piece structure with the first power line, and a second plate of the first capacitor forms a one-piece structure with the first connection part.

9. The display substrate according to claim 2, wherein the threshold compensation sub-circuit comprises a threshold compensation transistor, a gate electrode of the threshold compensation transistor in the $m^{th}$ row of pixel circuit is connected to the $(m-1)^{th}$ row of scan signal line, a second electrode of the threshold compensation transistor is connected to the second electrode of the driving transistor, and a first electrode of the threshold compensation transistor is connected to the gate electrode of the driving transistor.

10. The display substrate according to claim 9, wherein the first and second electrodes of the threshold compensation transistor are disposed in the same layer as the first and second electrodes of the driving transistor, and the second gate metal layer further comprises a second connection part spaced apart from the first connection part; and one end of the second connection part is connected to the first electrode of the threshold compensation transistor through an eighth via, the other end of the second connection part is connected to the gate electrode of the driving transistor through a ninth via, and the eighth via and the ninth via each penetrate through the first gate insulation layer and the second gate insulation layer.

11. The display substrate according to claim 9, wherein the gate electrode of the first gating transistor in the $m^{th}$ row of pixel circuit is connected to the $m^{th}$ row of scan signal line, and the gate electrode of the second gating transistor in the $m^{th}$ row of pixel circuit is connected to the $(m-1)^{th}$ row of scan signal line; and wherein the gate electrode of the first gating transistor in the $(m-1)^{th}$ row of pixel circuit, the gate electrode of the second gating transistor in the $m^{th}$ row of pixel circuit, and the gate electrode of the threshold compensation transistor in the $m^{th}$ row of pixel circuit form a one-piece structure.

12. The display substrate according to claim 11, wherein the gate electrode of the second gating transistor in the $m^{th}$ row of pixel circuit, the gate electrode of the first gating transistor in the $(m-1)^{th}$ row of pixel circuit, and the gate electrode of the threshold compensation transistor in the $m^{th}$ row of pixel circuit are arranged along an extending direction of the $(m-1)^{th}$ row of scan signal line.

13. The display substrate according to claim 9, wherein the gate electrode of the first gating transistor in the $m^{th}$ row of pixel circuit is connected to the $(m-1)^{th}$ row of scan signal line, and the gate electrode of the second gating transistor in the $m^{th}$ row of pixel circuit is connected to the $m^{th}$ row of scan signal line; and wherein the gate electrode of the second gating transistor in the $(m-1)^{th}$ row of pixel circuit, the gate electrode of the first gating transistor in the $m^{th}$ row of pixel circuit, and the gate electrode of the threshold compensation transistor in the $m^{th}$ row of pixel circuit form a one-piece structure.

14. The display substrate according to claim 13, wherein the gate electrode of the threshold compensation transistor in the $m^{th}$ row of pixel circuit, the gate electrode of the second gating transistor in the $(m-1)^{th}$ row of pixel circuit, and the gate electrode of the first gating transistor in the $m^{th}$ row of pixel circuit are arranged along an extending direction of the $(m-1)^{th}$ row of scan signal line.

15. A driving method applied to a display substrate, the display substrate being the display substrate according to claim 1, the driving method comprising:

providing, in a first input phase of the $m^{th}$ row of pixel circuit, a turn-on level signal to the $(m-1)^{th}$ row of scan signal line, and providing a turn-off level signal to the $m^{th}$ row of scan signal line, to allow the gating sub-circuit to provide a first signal to the second terminal of the first storage sub-circuit, and allow the threshold compensation sub-circuit to perform threshold compensation on the driving transistor;

providing, in a second input phase of the $m^{th}$ row of pixel circuit, a turn-off level signal to the $(m-1)^{th}$ row of scan signal line, and providing a turn-on level signal to the $m^{th}$ row of scan signal line, to allow the gating sub-circuit to provide a second signal to the second terminal of the first storage sub-circuit; and providing, in a light-emitting phase of the $m^{th}$ row of pixel circuit, a turn-off level signal to the $(m-1)^{th}$ row of scan signal line and the $m^{th}$ row of scan signal line, respectively, to allow the driving transistor to provide a light-emitting current to the light-emitting device according to a voltage difference between the gate electrode and the first electrode of the driving transistor;

wherein one of the first signal and the second signal is the data voltage signal, and the other is the reference voltage signal.

16. A display apparatus, comprising the display substrate according to claim 1.

* * * * *